United States Patent
Sugita et al.

(10) Patent No.: US 9,903,739 B2
(45) Date of Patent: Feb. 27, 2018

(54) SENSOR CHIP FOR ELECTROSTATIC CAPACITANCE MEASUREMENT AND MEASURING DEVICE HAVING THE SAME

(71) Applicant: TOKYO ELECTRON LIMITED, Tokyo (JP)

(72) Inventors: Kippei Sugita, Miyagi (JP); Tomohide Minami, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 64 days.

(21) Appl. No.: 15/179,189

(22) Filed: Jun. 10, 2016

(65) Prior Publication Data
US 2016/0363433 A1    Dec. 15, 2016

(30) Foreign Application Priority Data

Jun. 11, 2015 (JP) ................................. 2015-118184
Oct. 22, 2015 (JP) ................................. 2015-207787

(51) Int. Cl.
| | |
|---|---|
| *G01R 27/26* | (2006.01) |
| *G01D 5/241* | (2006.01) |
| *G06F 3/044* | (2006.01) |
| *G01D 5/24* | (2006.01) |
| *G06K 9/00* | (2006.01) |

(52) U.S. Cl.
CPC ............. *G01D 5/2417* (2013.01); *G01D 5/24* (2013.01); *G01R 27/2605* (2013.01); *G06F 3/044* (2013.01); *G06K 9/0002* (2013.01)

(58) Field of Classification Search
CPC ........ G01N 27/00; G01N 27/02; G01N 27/22; G01N 27/24; G01N 27/228; G01N 27/60; G01R 27/00; G01R 27/02; G01R 27/26; G01R 27/2605; G01R 31/26; G01R 31/2642; G01R 31/2648; G01R 31/265; G01R 31/2831; G01R 31/318511; G01R 1/0491; G01R 19/00; G01R 31/00; G01R 31/016; G06F 3/044; B23K 10/00; B23K 10/02; B23K 37/0461; H01J 37/32009;
(Continued)

(56) References Cited

U.S. PATENT DOCUMENTS

| | | | |
|---|---|---|---|
| 9,524,066 B2 * | 12/2016 | Yang | ......................... G06F 3/044 |
| 2004/0173913 A1 * | 9/2004 | Ohta | ................... B81C 1/00238 |
| | | | 257/777 |

(Continued)

FOREIGN PATENT DOCUMENTS

JP    4956328 B2    6/2012

*Primary Examiner* — Hoai-An D Nguyen
(74) *Attorney, Agent, or Firm* — Pearne & Gordon LLP

(57) ABSTRACT

Electrostatic capacitance can be measured with high directivity in a specific direction. A sensor chip that measures the electrostatic capacitance includes a first electrode, a second electrode and a third electrode. The first electrode has a first portion. The second electrode has a second portion extended on the first portion of the first electrode, and is insulated from the first electrode within the sensor chip. The third electrode has a front face extended in a direction which intersects with the first portion of the first electrode and the second portion of the second electrode, and is provided on the first portion and the second portion. The third electrode is insulated from the first electrode and the second electrode within the sensor chip.

10 Claims, 15 Drawing Sheets

(58) Field of Classification Search
CPC .... H01J 37/321; H01J 37/32211; G01D 5/24; G06K 9/0002; H03K 17/955
USPC ....... 324/600, 649, 658, 671, 676, 686, 713, 324/522, 537, 555, 757.01, 757.03, 324/762.01–762.06, 76.11, 679, 519, 548, 324/109, 457; 156/345.1, 345.35; 216/58, 59, 61, 63, 67; 219/121.11, 219/121.36, 121.39, 121.4, 121.43; 315/111.01, 111.21, 111.71, 111.81, 315/111.91; 702/1, 47, 52; 345/173, 174
See application file for complete search history.

(56) References Cited

U.S. PATENT DOCUMENTS

| | | | | |
|---|---|---|---|---|
| 2010/0072563 A1* | 3/2010 | Sato | ........................ | B81B 7/007 |
| | | | | 257/415 |
| 2013/0270707 A1* | 10/2013 | Furuhata | ............... | H01L 23/498 |
| | | | | 257/773 |
| 2014/0139761 A1* | 5/2014 | Yanagawa | ............... | G06F 3/044 |
| | | | | 349/12 |
| 2014/0225848 A1* | 8/2014 | Ogura | .................... | G06F 3/041 |
| | | | | 345/173 |
| 2015/0220204 A1* | 8/2015 | Noguchi | ............... | G06F 3/0412 |
| | | | | 345/174 |
| 2015/0363016 A1* | 12/2015 | Furutani | ................. | G09G 3/36 |
| | | | | 345/173 |

* cited by examiner

SENSOR CHIP FOR ELECTROSTATIC CAPACITANCE MEASUREMENT AND MEASURING DEVICE HAVING THE SAME

CROSS-REFERENCE TO RELATED APPLICATION

This application claims the benefit of Japanese Patent Application Nos. 2015-118184 and 2015-207787 filed on Jun. 11, 2015 and Oct. 22, 2015, respectively, the entire disclosures of which are incorporated herein by reference.

TECHNICAL FIELD

The embodiments described herein pertain generally to a sensor chip for electrostatic capacitance measurement and a measuring device having the sensor chip.

BACKGROUND

In the manufacture of an electronic device such as a semiconductor device, a processing apparatus for processing a processing target object is used. Generally, the processing apparatus includes a processing vessel and a mounting table. The processing target object is carried into the processing vessel by a transfer device and mounted on the mounting table. Then, the processing target objet is processed within the processing vessel.

The position of the processing target object on the mounting table is an important factor to satisfy various requirements such as processing uniformity within a surface of the processing target object. Accordingly, the transfer device needs to transfer the processing target object to a preset position on the mounting table. If the transfer position of the processing target object by the transfer device is deviated from the preset position, coordinate information specifying a transfer destination of the transfer device needs to be corrected.

To correct the coordinate information of the transfer device, the position of the processing target object on the mounting table needs to be detected. Conventionally, an electrostatic capacitance sensor has been used for this detection. The detection of the position with the electrostatic capacitance sensor is described in Patent Document 1, for example.

Patent Document 1: Japanese Patent No. 4,956,328

In a processing apparatus such as a plasma processing apparatus, there is provided a mounting table having an electrostatic chuck configured to attract and hold a processing target object. Further, a focus ring is provided on the mounting table to surround an edge of the processing target object.

FIG. 1 is a cross sectional view illustrating an example configuration of the electrostatic chuck and the focus ring. As depicted in FIG. 1, an electrostatic chuck ESC has a substantially disk shape. A focus ring FR is extended in a circumferential direction with respect to a central axis AXE of the electrostatic chuck ESC to surround the electrostatic chuck ESC. The focus ring FR includes a first portion P1 and a second portion P2. Each of the first potion P1 and the second portion P2 has a circular plate shape. The second portion P2 is provided on the first portion P1. An inner periphery P2$i$ of the second portion P2 has a diameter larger than a diameter of an inner periphery P1$i$ of the first portion P1. A processing target object (wafer W in FIG. 1) is mounted on the electrostatic chuck ESC such that an edge region thereof is located above the first portion P1 of the focus ring FR.

In the configuration using the electrostatic chuck ESC and the focus ring FR as stated above, if a distance (gap) between an edge of the processing target object and the inner periphery P2$i$ of the second portion P2 of the focus ring FR is not uniform in the circumferential direction, plasma distribution becomes non-uniform, so that non-uniformity in characteristics, such as fluctuation of an etching dimension within a surface of the processing target object is generated. Furthermore, local adhesion of particles to the processing target object may also occur. Thus, the coordinate information of the transfer device, that is, the coordinate information of the transfer destination of the processing target object needs to be corrected such that the distance between the edge of the processing target object and the inner periphery P2$i$ of the second portion P2 of the focus ring FR is substantially uniform in the circumferential direction. For this purpose, the distance between the edge of the processing target object and the inner periphery P2$i$ of the second portion P2 of the focus ring FR needs to be measured.

In this regard, the present inventors have been developing a technique in which a sensor chip for measuring electrostatic capacitance as a physical amount that reflects the distance is mounted on a measuring device having the same shape as the processing target object, the measuring device is transferred onto the electrostatic chuck by the transfer device, and the electrostatic capacitance is acquired by the measuring device. FIG. 2 provides a longitudinal cross sectional view illustrating an example structure of the sensor chip for measuring the electrostatic capacitance. A sensor chip 1000 shown in FIG. 2 is an example of a sensor chip capable of being mounted along an edge of the measuring device having the same shape as the processing target object. The sensor chip 1000 includes a substrate member 1002 and an electrode 1004. The substrate member 1002 has a main body 1002$m$. The main body 1002$m$ is made of, for example, silicon and an insulating region 1002$f$ is formed on a surface of the main body 1002$m$. The insulating region 1002$f$ is, for example, a thermal oxide film. The substrate member 1002 has a top surface 1002$a$, a bottom surface 1002$b$ and an end surface 1002$c$. The end surface 1002$c$ has a step shape, and a lower portion 1002$d$ of the end surface 1002$c$ protrudes toward the focus ring FR more than an upper portion 1002$u$ of the end surface 1002$c$. The electrode 1004 is provided along the upper portion 1002$u$ of the end surface 1002$c$.

FIG. 3 shows electrostatic capacitance measured by connecting the electrode of the sensor chip of FIG. 2 to an electrostatic capacitance meter. The electrostatic capacitance is measured while moving the sensor chip 1000 in a direction RD (FIG. 2) toward the inner periphery P2$i$ of the second portion P2 of the focus ring FR. Further, when measuring the electrostatic capacitance, a distance LVD (FIG. 2) between a top surface Pit of the first portion P1 and the bottom surface of the sensor chip 1000 is 100 μm. In FIG. 3, a horizontal axis represents a distance LRD (FIG. 2) between the lower portion 1002$d$ of the end surface 1002$c$ of the substrate member 1002 and the inner periphery P2$i$ of the second portion P2 of the focus ring FR, and a vertical axis indicates electrostatic capacitance. Further, FIG. 3 depicts both a calculation value of the electrostatic capacitance calculated by assuming that the electrostatic capacitance exists only in the direction RD and an actual measurement value of the electrostatic capacitance measured by the sensor chip 1000.

In comparison of the actual measurement value and the calculation value of the electrostatic capacitance shown in FIG. 3, the electrostatic capacitance (actual measurement value) measured by the sensor chip 1000 is found to sharply increase when the distance LRD is about 2.5 mm. This distance LRD of 2.5 mm is equal to a distance L12 (FIG. 2) between the inner periphery P2i of the second portion P2 and the inner periphery P1i of the first portion P1. Accordingly, this phenomenon implies that not only the electrostatic capacitance in the specific direction (direction RD of FIG. 2) in which the inner periphery (inner periphery P2i of the second portion P2) of the focus ring FR is provided with respect to the electrode 1004 of the sensor chip 1000, but electrostatic capacitance in a downward direction (direction VD of FIG. 2) also affects the measurement by the sensor chip 1000. In obtaining the distance LRD between the inner periphery of the focus ring FR and the sensor chip 1000, however, the electrostatic capacitance in the downward direction of the sensor chip 1000 is unnecessary.

Therefore, it is required to measure the electrostatic capacitance with high directivity in a specific direction.

SUMMARY

In one exemplary embodiment, a sensor chip that measures electrostatic capacitance is provided. The sensor chip includes a first electrode, a second electrode and a third electrode. The first electrode has a first portion. The second electrode has a second portion extended on the first portion and is insulated from the first electrode within the sensor chip. The third electrode has a front face extended in a direction which intersects with the first portion of the first electrode and the second portion of the second electrode, and is provided on the first portion and the second portion. The third electrode is insulated from the first electrode and the second electrode within the sensor chip.

In the sensor chip according to the exemplary embodiment, the third electrode as a sensor electrode is provided on the first portion of the first electrode, and the second portion of the second electrode is provided between the first portion of the first electrode and the third electrode. When using this sensor chip, an electric potential of the first electrode is set to be a ground potential, and a high frequency signal is output to the second electrode and the third electrode. At this time, a voltage amplitude of the third electrode only reflects electrostatic capacitance in a specific direction, i.e., in a direction to which a front face of the third electrode faces, without being affected by electrostatic capacitance in a direction in which the first electrode is provided with respect to the third electrode, i.e., electrostatic capacitance in a downward direction of the sensor chip. Therefore, by using this sensor chip, it is possible to measure the electrostatic capacitance with high directivity in the specific direction.

Further, the first electrode and the second electrode may be opened toward a side of a region where the front face of the third electrode is provided, and the first electrode and the second electrode may be extended to surround the third electrode. According to the present exemplary embodiment, the third electrode is shielded against directions other than the specific direction by the first electrode and the second electrode. Thus, the directivity toward the specific direction in measuring the electrostatic capacitance can be further improved.

The sensor chip may further include an end face. Here, the end face may be a curved surface having a preset curvature, and the front face of the third electrode may be extended along the end face. According to the present exemplary embodiment, distances between respective positions of the front face of the third electrode and an inner periphery of the focus ring in a radial direction can be set to be substantially equal. Therefore, accuracy of the measurement of the electrostatic capacitance can be improved.

The sensor chip may further include a substrate member. Here, the substrate member has a surface including a front face and a bottom face, and is insulated on the surface. The third electrode may be extended along the front face of the substrate member, and the second portion of the second electrode may be extended along the bottom face of the substrate member. The substrate member may be made of an insulating material. Since the substrate member is made of the insulating material, internal electrostatic capacitance of the sensor chip is reduced. Further, the insulating material may be borosilicate glass, silicon nitride, quartz or aluminum oxide.

In another exemplary embodiment, a measuring device that measures electrostatic capacitance is provided. Here, the measuring device includes a base substrate, sensor chips and a circuit board. The sensor chips are arranged along an edge of the base substrate, and each of the sensor chips is the sensor chip as described above. The circuit board is mounted on the base substrate. The circuit board includes a ground potential line, a high frequency oscillator, a C/V conversion circuit and an A/D converter. The ground potential line is allowed to be electrically connected to the first electrode. The high frequency oscillator is configured to generate a high frequency signal and electrically connected to the second electrode and the third electrode. The C/V conversion circuit is configured to convert a voltage amplitude in the third electrode of each of the sensor chips into a voltage signal indicating the electrostatic capacitance. The A/D converter is configured to convert the voltage signal output from the C/V conversion circuit to a digital value. By using the measuring device, it is possible to acquire a digital value indicating the electrostatic capacitance based on the voltage amplitude in the third electrode of the sensor chip.

The circuit board may further include a storage device and a communication device. The storage device is configured to store therein the digital value, and the communication device is configured to wirelessly transmit the digital value stored in the storage device. According to the present exemplary embodiment, the digital value stored in the storage device can be transmitted wirelessly.

The circuit board may further include a switch configured to connect the first electrode to the ground potential line selectively. When the first electrode is connected to the ground potential line, the measuring device is capable of measuring the electrostatic capacitance in the specific direction. Meanwhile, when the first electrode is disconnected from the ground potential line, the measuring device is capable of measuring combined electrostatic capacitance as a combination of the electrostatic capacitance in the specific direction and the electrostatic capacitance in the downward direction.

The base substrate may have a disk shape, and the sensor chips may be provided along the edge of the base substrate. In the present exemplary embodiment, each of the sensor chips has an end face which is a curved surface having a preset curvature. The front face of the third electrode is extended along the end face of each sensor chip. In the present exemplary embodiment, the measuring device may have substantially the same shape as a processing target object having a disk shape. Further, the measuring device is capable of measuring the electrostatic capacitance with high accuracy in the specific direction which reflects the distance between the focus ring and the edge of the measuring device.

According to the exemplary embodiments as described above, it is possible to measure electrostatic capacitance with high directivity in a specific direction.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
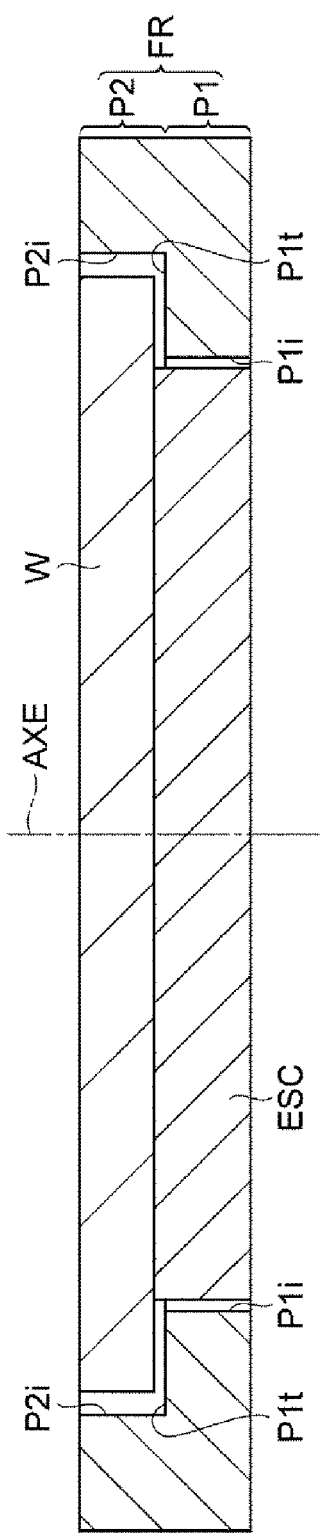
FIG. 1 is a cross sectional view illustrating an example configuration of an electrostatic chuck and a focus ring.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 4:
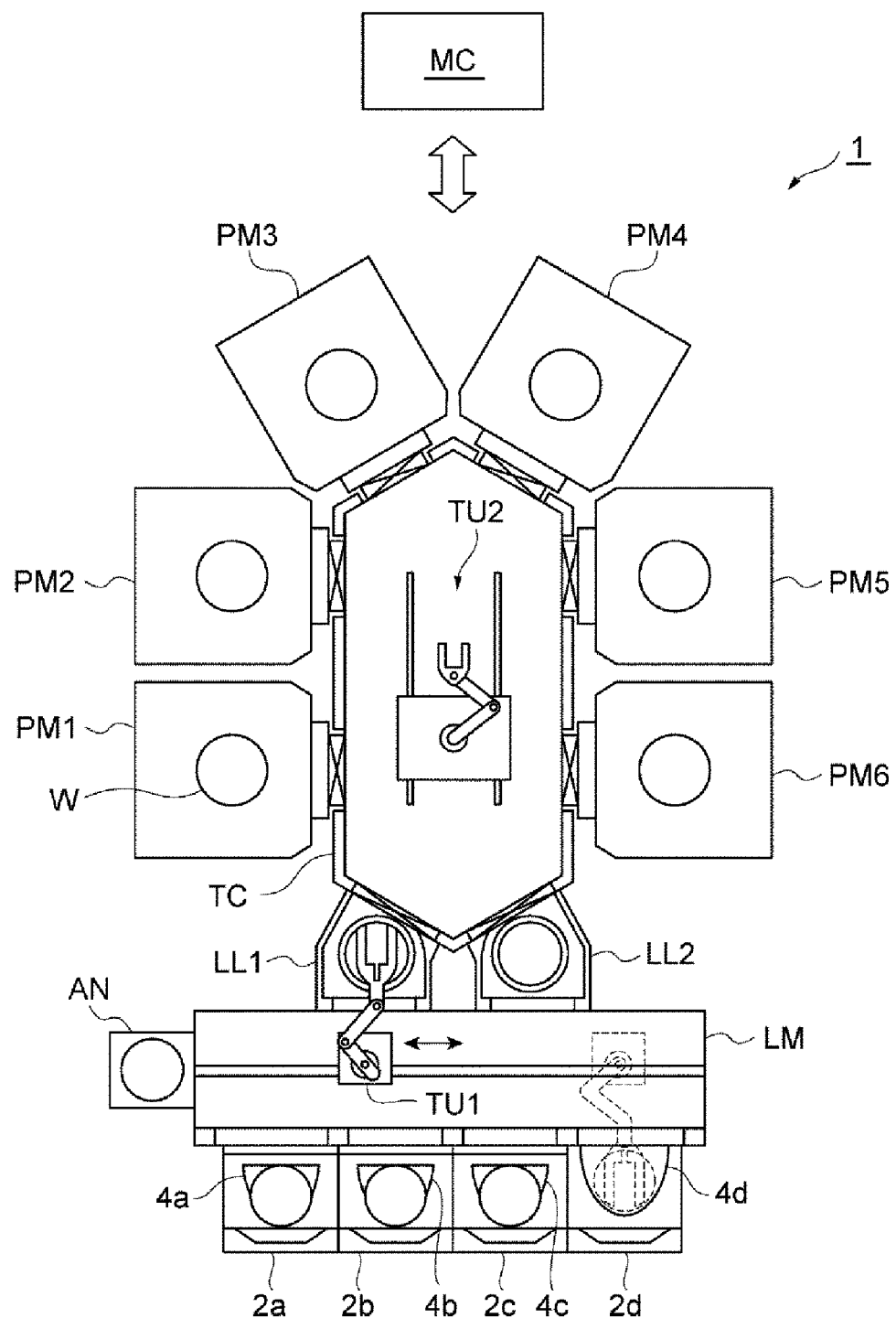
FIG. 4 is a diagram illustrating an example of a processing system equipped with a transfer device.

First, a processing system including a processing apparatus configured to process a processing target object (hereinafter, referred to as "wafer W") and a transfer device configured to transfer the processing target object into the processing apparatus will be explained. FIG. 4 is a diagram illustrating the processing system including the transfer device. The processing system 1 shown in FIG. 4 includes placing tables 2a to 2d, containers 4a to 4d, a loader module LM, an aligner AN, load lock chambers LL1 and LL2, process modules PM1 to PM6 and a transfer chamber TC.

The placing tables 2a to 2d are arranged along one side of the loader module LM. The containers 4a to 4d are mounted on the placing tables 2a to 2d, respectively. Each of the containers 4a to 4d is configured to accommodate wafers W therein.

The loader module LM includes a chamber wall that forms therein a transfer space which is maintained at an atmospheric pressure. The loader module LM has a transfer device TU1 within the transfer space. The transfer device TU1 is configured to transfer wafers W between the containers 4a to 4d and the aligner AN, between the aligner AN and the load lock chambers LL1 and LL2, and between the load lock chambers LL1 and LL2 and the containers 4a to 4d.

The aligner AN is connected to the loader module LM. The aligner AN is configured to perform position adjustment (position correction) of the wafer W. The position adjustment of the wafer W in the aligner AN may be performed by using an orientation flat or a notch of the wafer W.

The load lock chambers LL1 and the LL2 are provided between the loader module LM and the transfer chamber TC. Each of the load lock chamber LL1 and the load lock chamber LL2 provides a preliminary decompression room.

The transfer chamber TC is connected to the load lock chamber LL1 and the load lock chamber LL2 via respective gate valves. The transfer chamber TC provides a decompression room which can be decompressed, and a transfer device TU2 is accommodated in the decompression room. The transfer device TU2 is configured to transfer wafers W between the load lock chambers LL1, LL2 and the process modules PM1 to PM6 and between any two of the process modules PM1 to PM6.

The process modules PM1 to PM6 are connected to the transfer chamber TC via respective gate valves. Each of the process modules PM1 to PM6 is a processing apparatus configured to perform a preset process such as a plasma process on a wafer W.

A series of operations to perform the process on the wafer W in this processing system 1 is as follows, for example. The transfer device TU1 of the loader module LM takes out a wafer W from one of the containers 4a to 4d and transfers the wafer W into the aligner AN. Then, the transfer device TU1 takes out the wafer W, on which the position adjustment is performed, from the aligner AN and transfers the wafer W into one of the load lock chambers LL1 and LL2. Then, the corresponding load lock chamber decompresses the preliminary decompression room to a preset pressure. Thereafter, the transfer device TU2 of the transfer chamber TC takes out the wafer W from the corresponding load lock chamber and transfers the wafer W into one of the process modules PM1 to PM6. Here, at least one of the process modules PM1 to PM6 processes the wafer W. Afterwards, the transfer device TU2 transfers the processed wafer W from the corresponding process module into one of the load lock chambers LL1 and LL2. Then, the transfer device TU1 transfers the wafer W from the corresponding load lock chamber into one of the containers 4a to 4d.

The processing system 1 further includes a controller MC. The controller MC may be implemented by a computer including a processor, a storage device such as a memory, a display device, an input/output device, a communication device, and so forth. The controller MC controls the respective components of the processing system 1 according to a program stored in the storage device, so that the aforementioned series of operations of the processing system 1 are performed.

Figure 5:
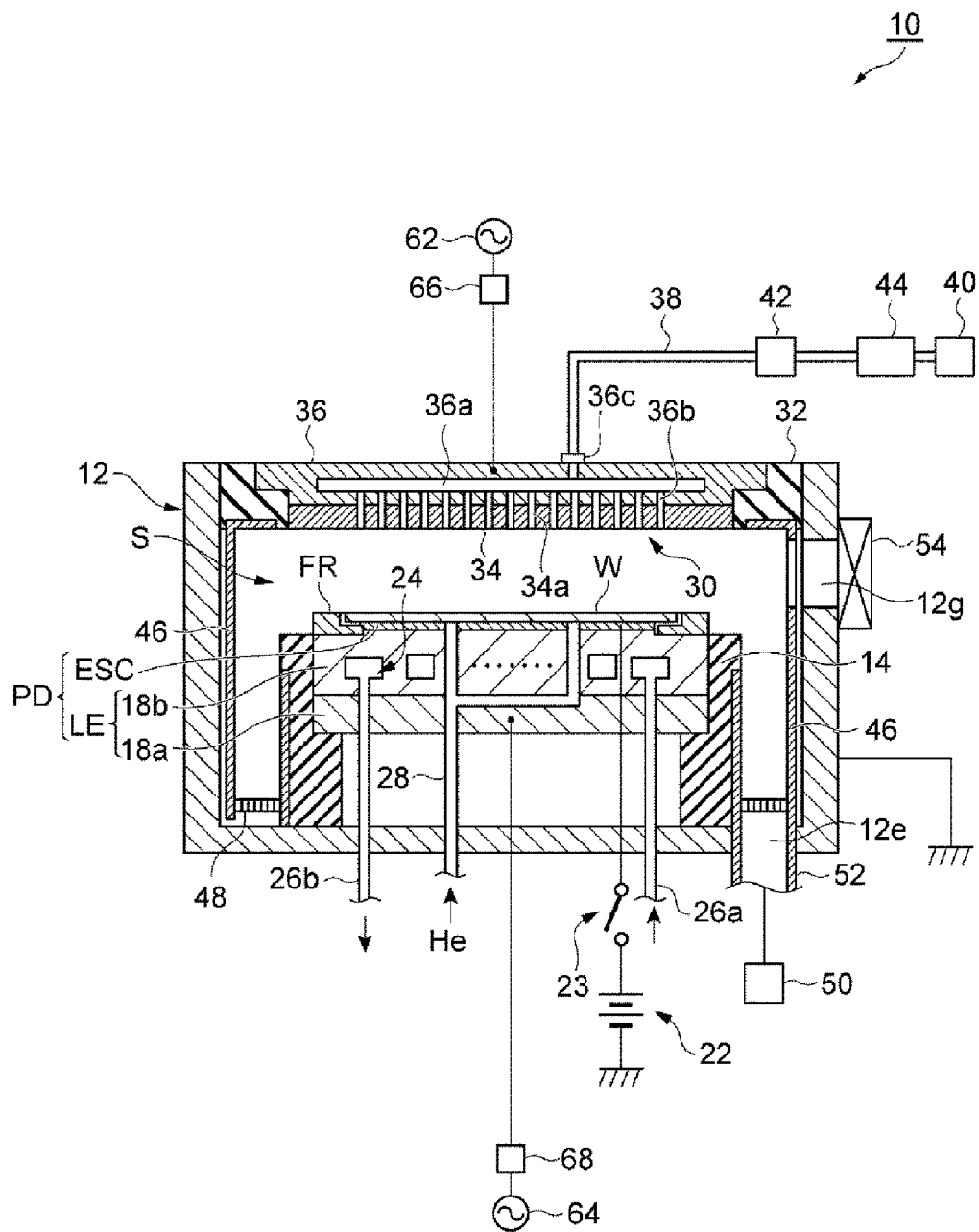
FIG. 5 is a diagram illustrating an example of a plasma processing apparatus.

FIG. 5 is a diagram illustrating an example of a plasma processing apparatus as one of the process modules PM1 to PM6. The plasma processing apparatus 10 shown in FIG. 5 is configured as a capacitively coupled plasma etching apparatus. The plasma processing apparatus 10 includes a substantially cylindrical processing vessel 12. The processing vessel 12 is made of, by way of non-limiting example, aluminum, and an inner wall surface of the processing vessel 12 may be anodically oxidized. The processing vessel 12 is frame-grounded.

A substantially cylindrical supporting member 14 is provided on a bottom portion of the processing vessel 12. The supporting member 14 is made of, by way of example, but not limitation, an insulating material. Within the processing vessel 12, the supporting member 14 is vertically extended from the bottom portion of the processing vessel 12. A mounting table PD is provided within the processing vessel 12. The mounting table PD is supported on the supporting member 14.

The mounting table PD includes a lower electrode LE and an electrostatic chuck ESC. The lower electrode LE includes a first plate 18a and a second plate 18b. Each of the first plate 18a and the second plate 18b is made of a metal such as, but not limited to, aluminum and has a substantially disk shape. The second plate 18b is provided on the first plate 18a and is electrically connected to the first plate 18a.

The electrostatic chuck ESC is provided on the second plate 18b. The electrostatic chuck ESC has a substantially disk shape, and includes a structure in which an electrode made of a conductive film is embedded between a pair of insulating layers or insulating sheets. The electrode of the electrostatic chuck ESC is electrically connected to a DC power supply 22 via a switch 23. The electrostatic chuck ESC is configured to attract and hold the wafer W by an electrostatic force such as a Coulomb force generated by a DC voltage applied from the DC power supply 22. Accordingly, the electrostatic chuck ESC is capable of holding the wafer W thereon.

A focus ring FR is provided on a peripheral portion of the second plate 18b. The focus ring FR is the same as the focus ring which is described above with reference to FIG. 1. That is, the focus ring FR is provided to surround the edge of the wafer W and the electrostatic chuck ESC. The focus ring FR includes the first portion P1 and the second portion P2. Each of the first portion P1 and the second portion P2 has an annular plate shape. The second portion P2 is provided on the first portion P1. The inner periphery P2i of the second portion P2 has a diameter larger than a diameter of the inner periphery Phi of the first portion P1. The wafer W is mounted on the electrostatic chuck ESC such that the edge region thereof is located above the first portion P1 of the focus ring FR. The focus ring FR may be made of any one of various materials such as silicon, silicon carbide, silicon oxide, etc.

A coolant path 24 is provided within the second plate 18b. The coolant path 24 constitutes a temperature control device. A coolant is supplied into the coolant path 24 from a chiller unit provided outside the processing vessel 12 via a pipeline 26a, and the coolant supplied into the coolant path 24 is returned back into the chiller unit via a pipeline 26b. With this configuration, the coolant is circulated between the coolant path 24 and the chiller unit. By controlling a temperature of the coolant, a temperature of the wafer W held on the electrostatic chuck ESC can be controlled.

Further, the plasma processing apparatus 10 is equipped with a gas supply line 28. Through the gas supply line 28, a heat transfer gas, for example, a He gas, is supplied from a heat transfer gas supply device into a gap between a top surface of the electrostatic chuck ESC and a rear surface of the wafer W.

Further, the plasma processing apparatus 10 includes an upper electrode 30. The upper electrode 30 is provided above the mounting table PD, facing the mounting table PD. Formed between the upper electrode 30 and the mounting table PD is a processing space S in which a plasma process is performed on the wafer W.

The upper electrode 30 is supported at an upper portion of the processing vessel 12 with an insulating shield member 32 therebetween. The upper electrode 30 may include a ceiling plate 34 and a supporting body 36. The ceiling plate 34 directly faces the processing space S and is provided with a multiple number of gas discharge holes 34a. The ceiling plate 34 may be formed of silicon or quartz. Alternatively, the ceiling plate 34 may be fabricated by forming a plasma-resistance film of, but not limited to, yttrium oxide on a surface of a substrate member which is made of aluminum.

The supporting body 36 is configured to support the ceiling plate 34 in a detachable manner, and is made of a conductive material such as, but not limited to, aluminum. The supporting body 36 may have a water-cooling structure. A gas diffusion space 36a is formed within the supporting body 36. A multiple number of gas through holes 36b is extended downwards from the gas diffusion space 36a, and these gas through holes 36b communicate with the gas discharge holes 34a, respectively. Further, the supporting body 36 is also provided with a gas inlet opening 36c through which a processing gas is introduced into the gas diffusion space 36a, and this gas inlet opening 36c is connected to a gas supply line 38.

The gas supply line 38 is connected to a gas source group 40 via a valve group 42 and a flow rate controller group 44. The gas source group 40 includes a plurality of gas sources. The valve group 42 includes a multiple number of valves, and the flow rate controller group 44 includes a multiple number of flow rate controllers such as mass flow controllers. Each of the gas sources belonging to the gas source group 40 is connected to the gas supply line 38 via each corresponding valve belonging to the valve group 42 and each corresponding flow rate controller belonging to the flow rate controller group 44.

Further, in the plasma processing apparatus 10, a deposition shield 46 is provided along an inner wall of the processing vessel 12 in a detachable manner. The deposition shield 46 is also provided on an outer side surface of the supporting member 14. The deposition shield 46 is configured to suppress an etching byproduct (deposit) from adhering to the processing vessel 12, and is formed by coating an aluminum member with ceramics such as $Y_2O_3$.

At the bottom portion side of the processing vessel 12, a gas exhaust plate 48 is provided between the supporting member 14 and a side wall of the processing vessel 12. The gas exhaust plate 48 may be made of, by way of example, an aluminum member coated with ceramic such as $Y_2O_3$. The gas exhaust plate 48 is provided with a multiple number of through holes in a plate thickness direction thereof. The processing vessel 12 is also provided with a gas exhaust opening 12e under the gas exhaust plate 48, and the gas exhaust opening 12e is connected with a gas exhaust device 50 via a gas exhaust line 52. The gas exhaust device 50 includes a pressure control valve and a vacuum pump such as a turbo molecular pump, and is capable of decompressing the space within the processing vessel 12 to a required pressure level. Further, a carry-in/out opening 12g for the wafer W is provided at the side wall of the processing vessel 12, and the carry-in/out opening 12g is opened or closed by a gate valve 54.

Furthermore, the plasma processing apparatus 10 includes a first high frequency power supply 62 and a second high frequency power supply 64. The first high frequency power supply 62 is configured to generate a high frequency power for plasma generation having a frequency in the range from, for example, 27 MHz to 100 MHz. The first high frequency power supply 62 is connected to the upper electrode 30 via a matching device 66. The matching device 66 includes a circuit configured to match an output impedance of the first high frequency power supply 62 and an input impedance at a load side (upper electrode 30). Further, the first high frequency power supply 62 may be connected to the lower electrode LE via the matching device 66.

The second high frequency power supply 64 is configured to generate a high frequency bias power for attracting ions into the wafer W. For example, the second high frequency power supply 64 generates the high frequency bias power having a frequency in the range from 400 kHz to 13.56 MHz. The second high frequency power supply 64 is connected to the lower electrode LE via a matching device 68. The matching device 68 includes a circuit configured to match an output impedance of the second high frequency power supply 64 and an input impedance at a load side (lower electrode LE).

In the plasma processing apparatus 10 having the above-described configuration, a gas from one or more gas sources selected from the gas sources is supplied into the processing vessel 12. Further, a pressure in the space within the processing vessel 12 is set to a preset pressure by the gas exhaust device 50. The gas within the processing vessel 12 is excited by the high frequency power from the first high frequency power supply 62, so that plasma is generated, and the wafer W is processed by generated active species. Further, when necessary, ions may be attracted into the wafer W by the high frequency bias power from the second high frequency power supply 64.

Figure 6:
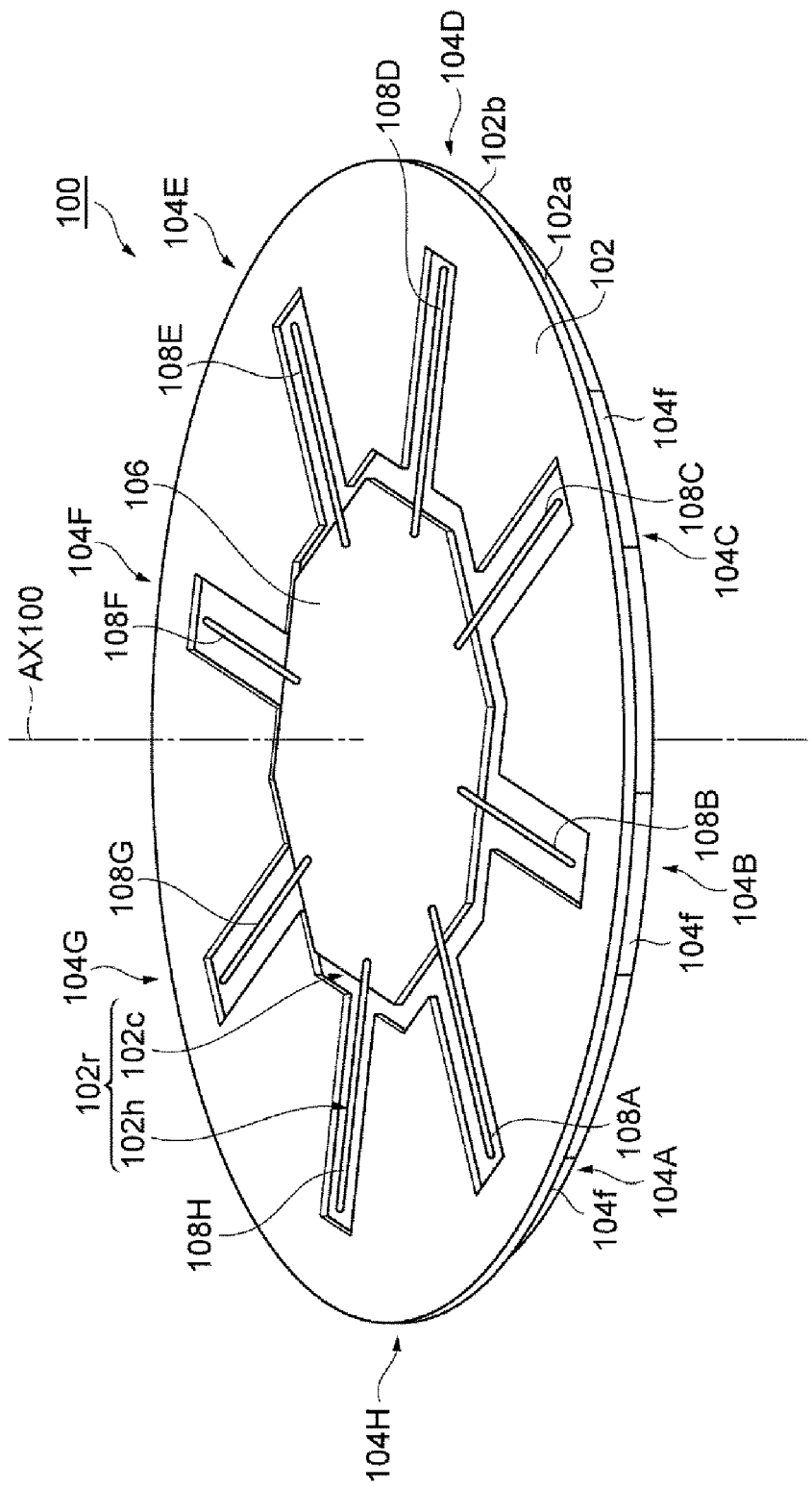
FIG. 6 is a perspective view of a measuring device in accordance with an exemplary embodiment.

Now, an exemplary embodiment of a measuring device configured to measure the electrostatic capacitance reflecting the distance with respect to the focus ring FR will be explained. FIG. 6 is a perspective view of the measuring device according to the exemplary embodiment. The measuring device 100 depicted in FIG. 6 includes a base substrate 102. The base substrate 102 is made of, by way of example, but not limitation, silicon and has a substantially disk shape, the same as the wafer W. The base substrate 102 has a diameter equal to a diameter of the wafer W, for example, 300 mm.

The base substrate 102 has a lower portion 102a and an upper portion 102b. The lower portion 102a is located closer to the electrostatic chuck ESC than the upper portion 102b is, when the measuring device 100 is placed on the electrostatic chuck ESC. A plurality of sensor chips 104A to 104H configured to measure the electrostatic capacitance is provided at the lower portion 102a of the base substrate 102. The number of the sensor chips mounted to the measuring device 100 may be three or more. The sensor chips 104A to 104H are arranged at a regular interval along an edge of the base substrate 102, for example, along the entire circumference of the edge thereof. To be specific, the sensor chips 104A to 104H are provided such that front end faces 104f thereof are arranged along the edge of the lower portion 102a of the base substrate 102. In FIG. 6, among the sensor chips 104A to 104H, only the sensor chips 104A to 104C are depicted.

A top surface of the upper portion 102b of the base substrate 102 is provided with a recess 102r. The recess 102r includes a central region 102c and a plurality of radial regions 102h. The central region 102c intersects with a central axis AX100. The central axis AX100 is an axis that passes through a center of the base substrate 102 in a thickness direction thereof. A circuit board 106 is provided at the central region 102c. The radial regions 102h are extended in radial directions with respect to the central axis AX100 from the central region 102c up to above regions where the sensor chips 104A to 104H are provided. Provided in the radial regions 102h is a plurality of wiring groups 108A to 108H which are configured to electrically connect the sensor chips 104A to 104H to the circuit board 106, respectively. In the measuring device 100 of FIG. 6, the sensor chips 104A to 104H are shown to be mounted to the lower portion 102a of the base substrate 102. Alternatively, however, the sensor chips 104A to 104H may be mounted to the upper portion 102b of the base substrate 102.

Figure 7:
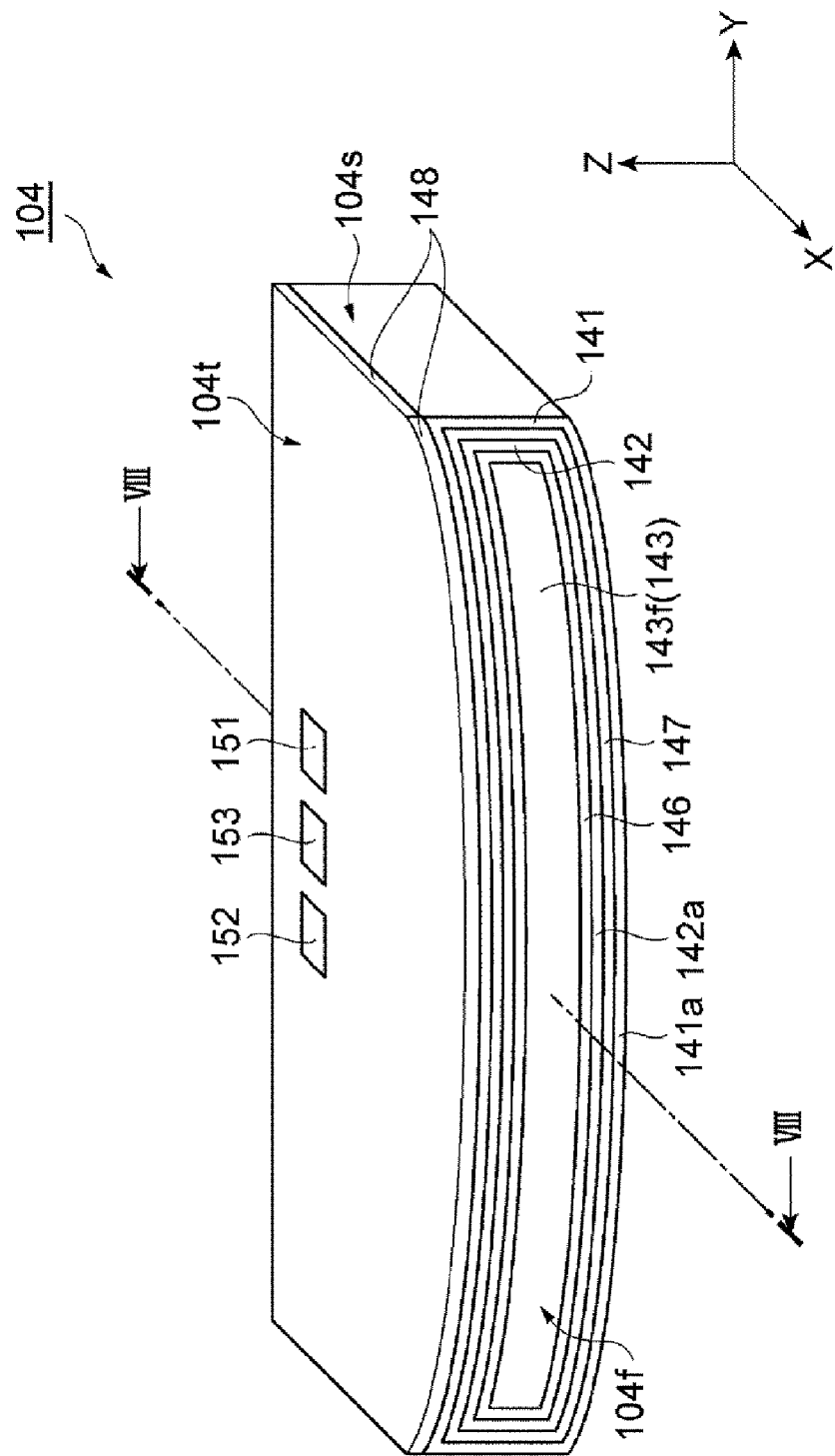
FIG. 7 is a perspective view of a sensor chip according to the exemplary embodiment.
Figure 8:
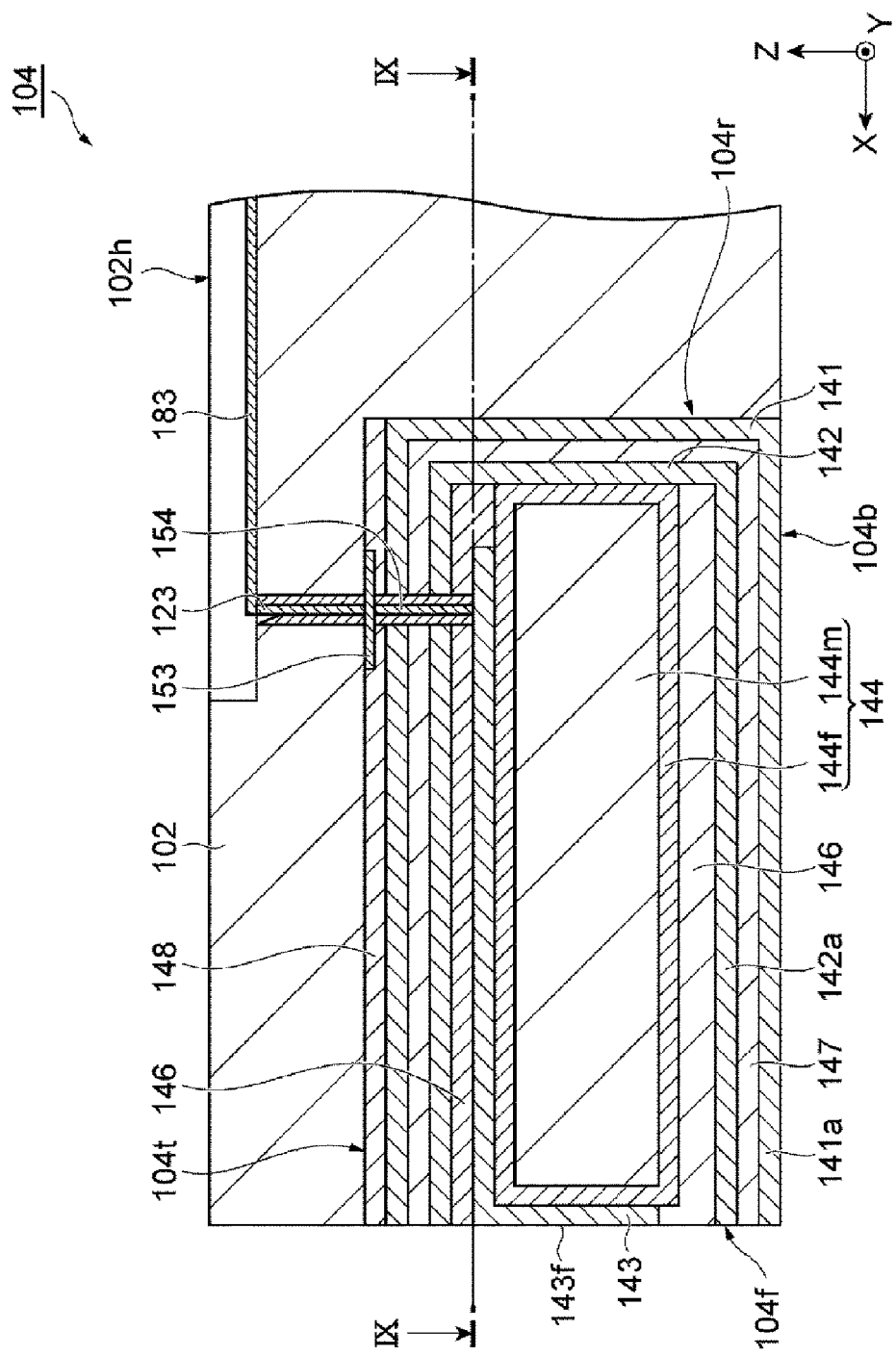
FIG. 8 is a cross sectional view taken along a line VIII-VIII of FIG. 7.
Figure 9:
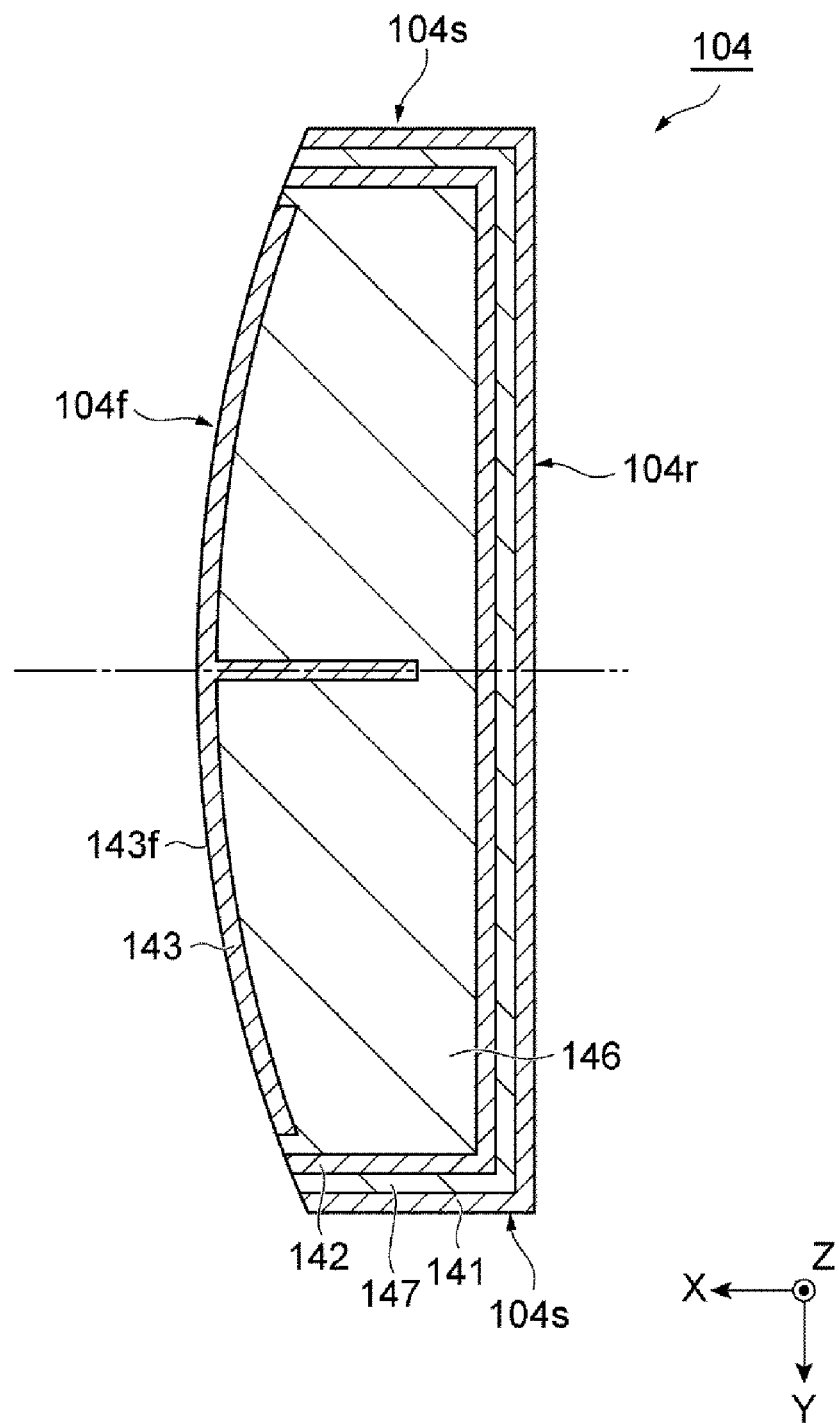
FIG. 9 is a cross sectional view taken along a line IX-IX of FIG. 8.

Hereinafter, the sensor chip will be elaborated. FIG. 7 is a perspective view illustrating the sensor chip according to the exemplary embodiment. FIG. 8 is a cross sectional view taken along a line VIII-VIII of FIG. 7, and illustrates the base substrate of the measuring device as well as the sensor chip. FIG. 9 is a cross sectional view taken along a line IX-IX of FIG. 8. A sensor chip 104 depicted in FIG. 7 to FIG. 9 is a sensor chip used as the sensor chips 104A to 104H of the measuring device 100. Further, the following description will be provided with reference to an XYZ orthogonal coordinates system appropriately. The X direction represents a front direction of the sensor chip 104; the Y direction, a width direction of the sensor chip 104 as one direction orthogonal to the X direction; and the Z direction, an upward direction of the sensor chip 104 orthogonal to the X direction and the Y direction.

As depicted in FIG. 7 to FIG. 9, in the exemplary embodiment, the sensor chip 104 includes a front end face 104f, a top face 104t, a bottom face 104b and a pair of side faces 104s and a rear end face 104r. The front end face 104f constitutes a front surface of the sensor chip 104 in the X direction. The sensor chip 104 is mounted to the base substrate 102 of the measuring device 100 such that the front end face 104f thereof faces in the radial direction with respect to the central axis AX100 (see FIG. 6). Further, in the state that the sensor chip 104 is mounted to the base substrate 102, the front end face 104f is extended along the edge of the base substrate 102. Accordingly, when the measuring device 100 is placed on the electrostatic chuck ESC, the front end face 104f is confronted with the inner periphery of the focus ring FR.

The rear end face 104r constitutes a rear surface of the sensor chip 104 in the X direction. In the state that the sensor chip 104 is mounted to the base substrate 102, the rear end face 104r is positioned closer to the central axis AX100 than the front end face 104f is. The top face 104t constitutes a top surface of the sensor chip 104 in the Z direction, and the bottom face 104b constitutes a bottom surface of the sensor chip 104 in the Z direction. Further, the pair of side faces 104s constitutes side surfaces of the sensor chip 104 in the Y direction.

The sensor chip 104 is equipped with a first electrode 141, a second electrode 142 and a third electrode 143. The first electrode 141 is made of a conductor. The first electrode 141 has a first portion 141a. As depicted in FIG. 7 and FIG. 8, the first portion 141a is extended in the X and Y directions according to the exemplary embodiment.

The second electrode 142 is also made of a conductor. The second electrode 142 has a second portion 142a. The second portion 142a is extended on the first portion 141a. Within the sensor chip 104, the second electrode 142 is insulated from the first electrode 141. As shown in FIG. 7 and FIG. 8, in the exemplary embodiment, the second portion 142a is extended on the first portion 141a in the X and Y directions.

The third electrode 143 is a sensor electrode made of a conductor, and is provided on the first portion 141a of the first electrode 141 and the second portion 142a of the second electrode 142. The third electrode 143 is insulated from the first electrode 141 and the second electrode 142 within the sensor chip 104. The third electrode 143 has a front face 143f. The front face 143f is extended in a direction that intersects with the first portion 141a and the second portion 142a. Further, the front face 143f is extended along the front end face 104f of the sensor chip 104. In the present exemplary embodiment, the front face 143f constitutes a part of the front end face 104f of the sensor chip 104. Alternatively, the sensor chip 104 may be provided with, at the front side of the front face 143f of the third electrode 143, an insulating layer that covers the front face 143f.

As depicted in FIG. 7 to FIG. 9, the first electrode 141 and the second electrode 142 are opened toward the side (X direction) of the region where the front face 143f of the third electrode 143 is provided and is extended to surround the third electrode 143. That is, the first electrode 141 and the second electrode 142 are extended to surround the third electrode 143 from above, from behind and from the sides of the third electrode 143.

Further, as illustrated in FIG. 7 and FIG. 9, in the exemplary embodiment, the front end face 104f of the sensor chip 104 is a curved surface having a preset curvature. That is, the front end face 104f has a constant curvature at certain positions thereof, and the curvature of the front end face 104f is a reciprocal of a distance between the central axis AX100 of the measurement device 100 and the front end face 104f. The sensor chip 104 is mounted to the base substrate 102 such that the center of curvature of the front end face 104f coincides with the central axis AX100.

In the present exemplary embodiment, the sensor chip 104 may further include a substrate member 144, insulating regions 146 to 148, pads 151 to 153 and a via wiring 154. The substrate member 144 has a main body 144m and a surface member 144f. The main body 144m is made of, but not limited to, silicon. The surface member 144f covers a surface of the main body 144m. The surface member 144f is made of an insulating material. By way of non-limiting example, the surface member 144f is a thermal oxide film of silicon.

The second portion 142a of the second electrode 142 is extended under the substrate member 144, and the insulating region 146 is provided between the substrate member 144 and the second electrode 142. The insulating region 146 is made of, but not limited to, $SiO_2$, SiN, $Al_2O_3$ or polyimide.

The first portion 141a of the first electrode 141 is extended under the substrate member 144 and the second portion 142a of the second electrode 142. The insulating region 147 is provided between the first electrode 141 and the second electrode 142. The insulating region 147 is made of, by way of example, but not limitation, $SiO_2$, SiN, $Al_2O_3$ or polyimide.

The insulating region 148 constitutes the top face 104t of the sensor chip 104. The insulating region 148 is made of, by way of non-limiting example, $SiO_2$, SiN, $Al_2O_3$ or polyimide. The pads 151 to 153 are formed on this insulating region 148. The pad 153 is made of a conductor and is connected to the third electrode 143. To elaborate, the third electrode 143 and the pad 153 are connected to each other via the via wiring 154 which penetrates the insulating region 146, the second electrode 142, the insulating region 147 and the first electrode 141. An insulator is provided around the via wiring 154, and the via wiring 154 is insulated from the first electrode 141 and the second electrode 142. The pad 153 is connected to the circuit board 106 via a via wiring 123 provided in the base substrate 102 and a wiring 183 provided in the radial region 102h of the recess 102r. The pad 151 and the pad 152 are also made of a conductor. The pad 151 and the pad 152 are connected to the first electrode 141 and the second electrode 142 via corresponding via wirings, respectively. Further, the pad 151 and the pad 152 are connected to the circuit board 106 via corresponding via wirings provided in the base substrate 102 and corresponding wirings provided in the radial region 102h of the recess 102r.

Figure 10:
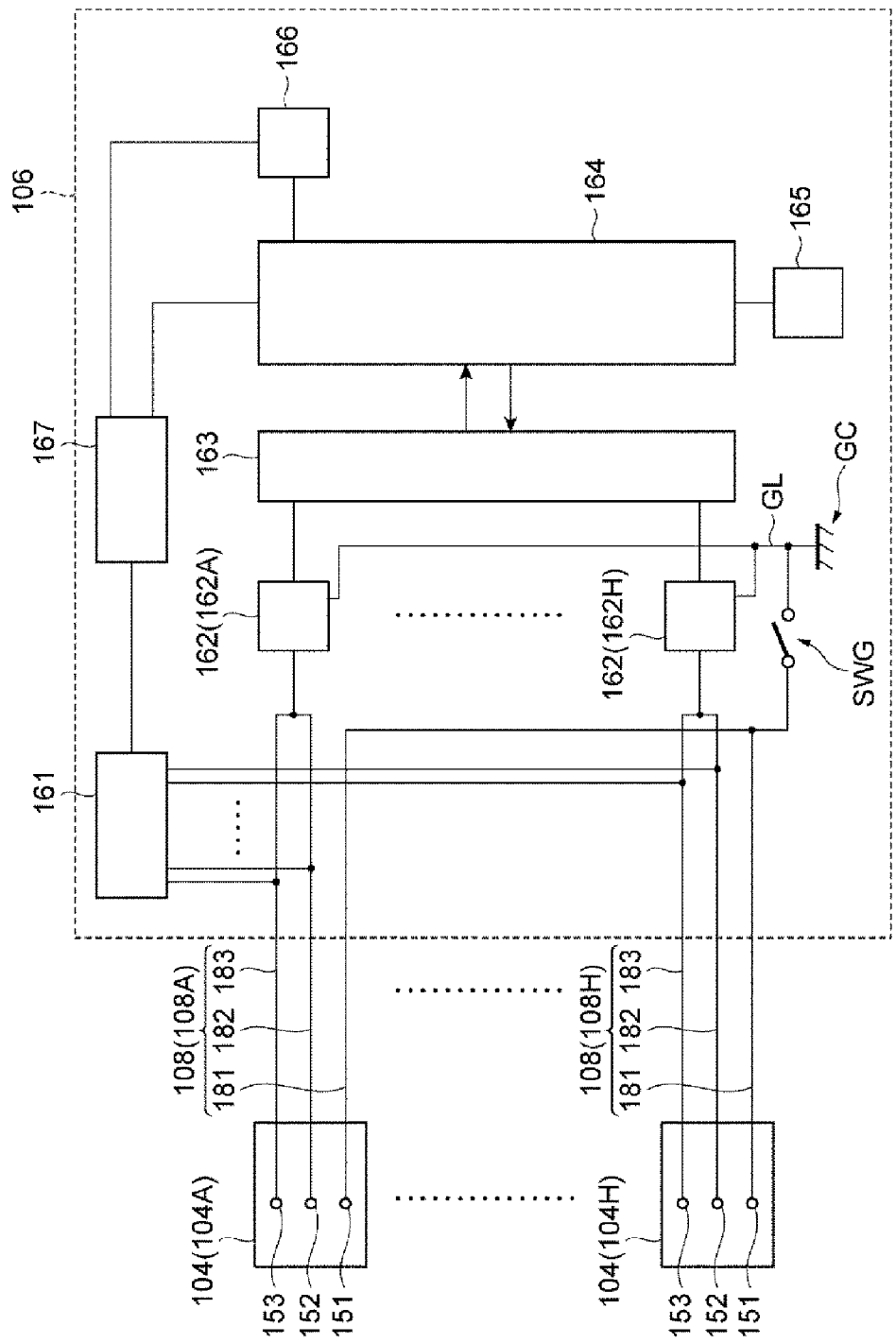
FIG. 10 is a diagram illustrating a configuration of a circuit board according to the exemplary embodiment.

Now, a configuration of the circuit board 106 will be explained. FIG. 10 is a diagram illustrating a configuration of the circuit board according to the exemplary embodiment. As depicted in FIG. 10, the circuit board 106 includes a high frequency oscillator 161, a multiple number of C/V conversion circuits 162A to 162H and an A/D converter 163. In the exemplary embodiment, the circuit board 106 may further include a storage device 165 and a communication device 166. Further, in another exemplary embodiment, the circuit board 106 may further include a processor 164 and a power supply 167.

Each of the sensor chips 104A to 104H is connected to the circuit board 106 via each corresponding one of the wiring groups 108A to 108H. Further, each of the sensor chips 104A to 104H is connected to each corresponding one of the C/V conversion circuits 162A to 162H via some wirings belonging to corresponding one of the wiring groups. Hereinafter, a single sensor chip 104 having the same configuration as each of the sensor chips 104A to 104H, a single wiring group 108 having the same configuration as each of the wiring groups 108A to 108H and a single C/V conversion circuit 162 having the same configuration as each of the C/V conversion circuits 162A to 162H will be explained.

The wiring group 108 includes wirings 181 to 183. One end of the wiring 181 is connected to the pad 151 which is coupled to the first electrode 141. The other end of the wiring 181 is connected via a switch SWG to a ground potential line GL which is connected to a ground GC of the circuit board 106. Further, one end of the wiring 182 is connected to the pad 152 which is coupled to the second electrode 142, and the other end of the wiring 182 is coupled to the C/V conversion circuit 162. Furthermore, one end of the wiring 183 is connected to the pad 153 which is coupled to the third electrode 143, and the other end of the wiring 183 is connected to the C/V conversion circuit 162.

The high frequency oscillator 161 is connected to the power supply 167 such as a battery, and is configured to generate a high frequency signal by receiving a power from the power supply 167. Further, the power supply 167 is also connected to the processor 164 and the communication device 166. The high frequency oscillator 161 includes a multiple number of output lines. The high frequency oscillator 161 is configured to output the generated high frequency signal to the wiring 182 and the wiring 183 via the multiple number of output lines. Accordingly, the high frequency signal from the high frequency oscillator 161 is output to the second electrode 142 and the third electrode 143 of the sensor chip 104.

The wiring 182 and the wiring 183 are connected to an input terminal of the C/V conversion circuit 162. That is, the second electrode 142 and the third electrode 143 of the sensor chip 104 are connected to the input terminal of the C/V conversion circuit 162. The C/V conversion circuit 162 is configured to generate, based on a voltage amplitude at the input terminal thereof, a voltage signal indicating electrostatic capacitance formed by the electrodes connected to the input terminal, and output the generated voltage signal. Further, as the electrostatic capacitance formed by the electrodes connected to the C/V conversion circuit 162 increases, the magnitude of the voltage of the voltage signal output from the C/V conversion circuit 162 also increases.

Figure 11:
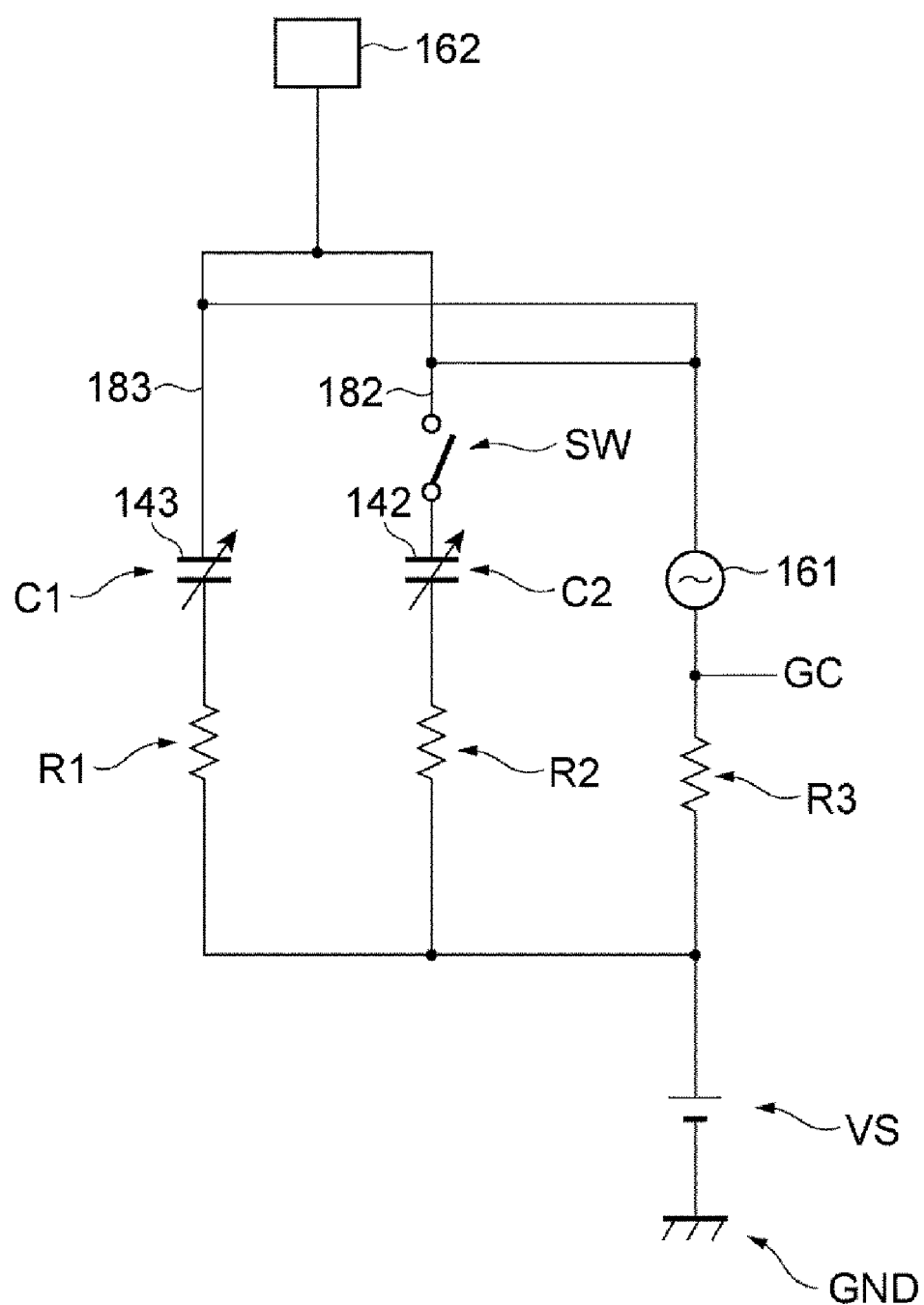
FIG. 11 is an equivalent circuit diagram of the circuit board 106 and the sensor chip 104.

FIG. 11 depicts an equivalent circuit of the circuit board 106 and the sensor chip 104. In FIG. 11, a capacitive element C1 is an element corresponding to electrostatic capacitance formed by the third electrode 143 of the sensor chip 104 at the front of the third electrode 143 (in the X direction). Further, a capacitive element C2 is an element corresponding to electrostatic capacitance formed by the second electrode 142 of the sensor chip 104 under the second electrode 142 (in the negative Z direction). The measuring device 100 can be transferred by the transfer device, and a ground GC of the circuit board 106 is not connected to a ground GND of the process module. Accordingly, an electric potential of the ground GC of the circuit board 106 is different from an electric potential of the ground GND. Thus, in the equivalent circuit of FIG. 11, the ground GC is shown to be connected to the ground GND via a voltage source VS and a resistor R3. Further, in the equivalent circuit, one end of the capacitive element C1 is connected to the ground GND via the voltage source VS and a resistor R1, and one end of the capacitive element C2 is connected to the ground GND via the voltage source VS and a resistor R2. Furthermore, the other end of the capacitive element C1, i.e., the third electrode 143 is connected to the high frequency oscillator 161, and the other end of the capacitive element C2, i.e., the second electrode 142 is connected to the high frequency oscillator 161 via a switch SW.

In the state that the wiring 181 is connected to the ground potential line GL, the switch SW is in an open state in the equivalent circuit of FIG. 11. Accordingly, in the state that the wiring 181 is connected to the ground potential line GL, the second electrode 142 is disconnected from the C/V conversion circuit 162. Thus, in this state, the C/V conversion circuit 162 outputs the voltage signal having a magnitude corresponding to a magnitude of the electrostatic capacitance formed by the third electrode 143. Meanwhile, in the state that the wiring 181 is disconnected from the ground potential line GL, the switch SW is in a closed state in the equivalent circuit of FIG. 11. Accordingly, in the state that the wiring 181 is not connected to the ground potential line GL, the second electrode 142 is connected to the C/V conversion circuit 162. In this state, the C/V conversion circuit 162 outputs the voltage signal having a magnitude corresponding to the sum of the electrostatic capacitance formed by the third electrode 143 at the front thereof (in the X direction) and the electrostatic capacitance formed by the second electrode 142 under the second electrode 142 (in the negative Z direction).

Output terminals of the C/V conversion circuits 162A to 162H are connected to an input terminal of the A/D converter 163. Further, the A/D converter 163 is connected to the processor 164. The A/D converter 163 is controlled by a control signal from the processor 164, and is configured to convert the output signals (voltage signals) of the C/V conversion circuits 162A to 162H to digital values. That is, the A/D converter 163 is configured to generate a digital value indicating the magnitude of the electrostatic capacitance and output the digital value to the processor 164.

The processor 164 is connected to the storage device 165. The storage device 165 is implemented by, by way of non-limiting example, a nonvolatile memory and is configured to store therein the digital values output from the A/D converter 163.

The communication device 166 follows the wireless communication standards. For example, the communication device 166 is based on Bluetooth (registered trademark). The communication device 166 is configured to wirelessly transmit the digital values stored in the storage device 165.

As stated above, in the sensor chip 104 mounted on the measuring device 100, the third electrode 143 as the sensor electrode is provided on the first electrode 141, and the second portion of the second electrode 142 is provided between the first electrode 141 and the third electrode 143. When using the sensor chip 104, the electric potential of the first electrode 141 is set to a ground potential, and the high frequency signal is output to both the second electrode 142 and the third electrode 143. At this time, the voltage amplitude of the third electrode 143 is not affected by the electrostatic capacitance in the direction where the first electrode 141 is provided with respect to the third electrode 143, i.e., electrostatic capacitance from below the sensor chip 104, but is affected by the electrostatic capacitance in a certain direction, i.e., in the direction (X direction) to which the front face 143f of the third electrode 143 faces. Accordingly, according to the sensor chip 104, it is possible to measure the electrostatic capacitance having high directivity in the certain direction.

Further, in the exemplary embodiment, the first electrode 141 and the second electrode 142 are opened at the side of the region where the front face of the third electrode 143 is located (i.e., opened in the X direction), and are extended to surround the third electrode 143. According to the present exemplary embodiment, the third electrode 143 is shielded against a direction other than the certain direction by the first electrode 141 and the second electrode 142. Thus, when measuring the electrostatic capacitance, the directivity of the sensor chip 104 toward the certain direction is further improved.

Further, in the exemplary embodiment, the front end face 104f of the sensor chip 104 is formed as a curved surface having a preset curvature, and the front face 143f of the third electrode 143 is extended along the front end face 104f. According to this exemplary embodiment, a distance between each position of the front face 143f of the third electrode 143 and the inner periphery of the focus ring FR in the radial direction can be set to be a substantially equal distance. Accordingly, the accuracy of the measurement of the electrostatic capacitance can be further improved.

Moreover, in the measuring device 100, the sensor chips 104A to 104H are arranged along the edge of the base substrate 102. Accordingly, if this measuring device 100 is placed on the electrostatic chuck ESC, a plurality of digital values indicating the electrostatic capacitance between the focus ring FR and each of the sensor chips 104A to 104H can be acquired. Further, the electrostatic capacitance C is expressed as C=εS/d. Here, ε may be regarded as a dielectric constant of a medium between the front face 143f of the third electrode 143 and the inner periphery of the focus ring FR; S, an area of the front face 143f of the third electrode 143; and d, a distance between the front face 143f of the third electrode 143 and the inner periphery of the focus ring FR. Thus, the digital values obtained by the measuring device 100 are decreased as the distance between the front face 143f of the third electrode 143 and the inner periphery of the focus ring FR is increased.

In the exemplary embodiment, the measuring device 100 is configured to store the digital values in the storage device 165 and transmit the digital values to the communication device 166 wirelessly. By using the wirelessly transmitted digital values, it is possible to correct the coordinate information of the transfer destination of the transfer device such that the distance (gap) (in the radial direction with respect to the central axis AX100) between the edge of the measuring device 100 and the periphery of the focus ring FR is uniform in the circumferential direction thereof.

Figure 12:
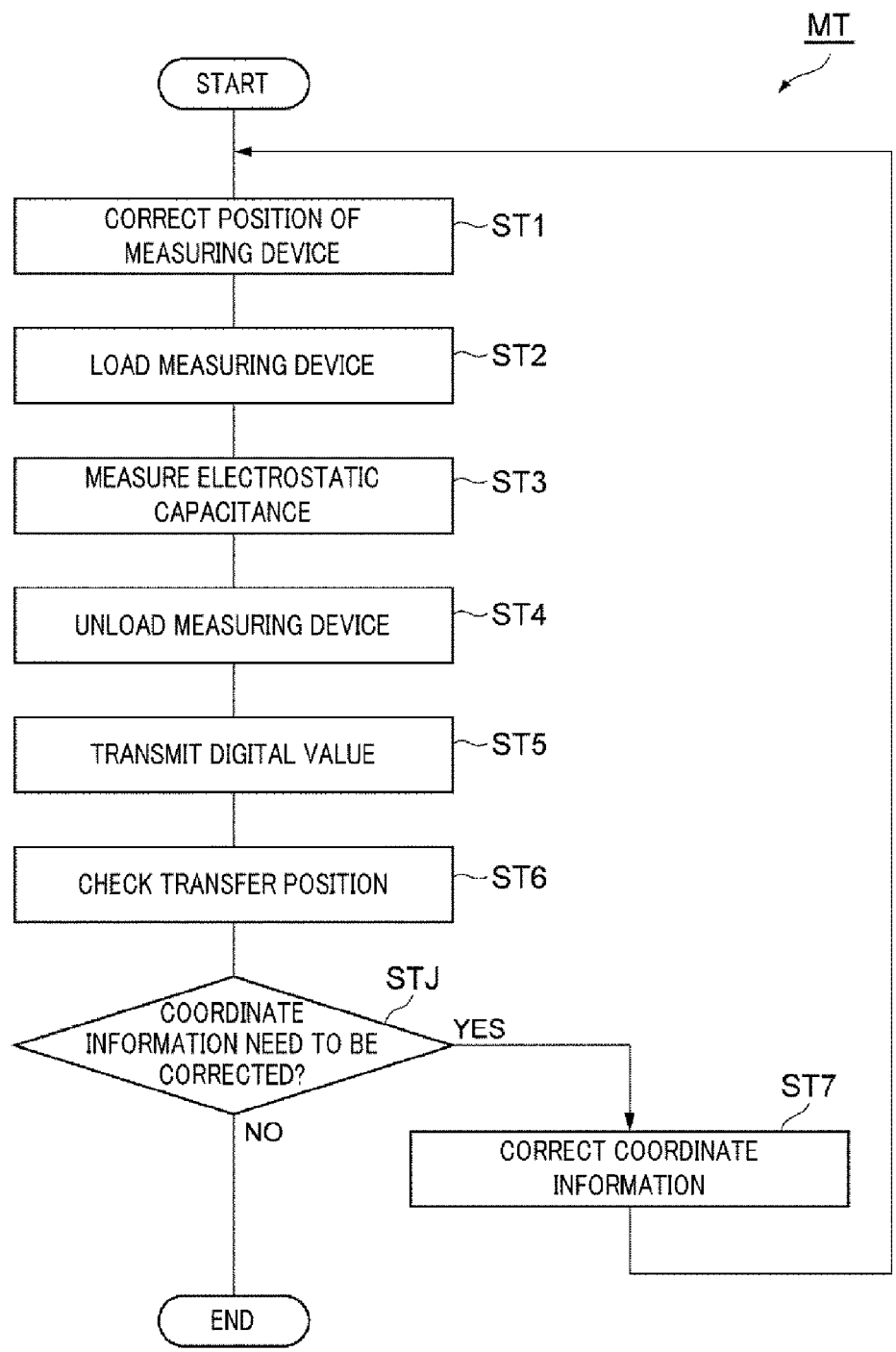
FIG. 12 is a flowchart for describing a method of adjusting the transfer device in the processing system according to the exemplary embodiment.

Hereinafter, a method of controlling the transfer device of the processing system 1 with the measuring device 100 will be elaborated. FIG. 12 is a flowchart for describing the method of controlling the transfer device of the processing system according to the exemplary embodiment. In a method MT described in FIG. 12, the measuring device 100 accommodated in one of the containers 4a to 4d is carried into the aligner AN by the transfer device TU1. Then, in a process ST1, the position adjustment (position correction) of the measuring device 100 is performed by the aligner AN.

In a subsequent process ST2, the measuring device 100 is transferred into one of the process modules PM1 to PM6. To elaborate, the measuring device 100 is transferred into one of the load lock chamber LL1 and the load lock chamber LL2 by the transfer device TU1. Subsequently, the measuring device 100 is transferred from the corresponding load lock chamber into one of the process modules PM1 to PM6 by the transfer device TU2 and mounted on the electrostatic chuck ESC.

In a subsequent process ST3, the measuring device 100 measures electrostatic capacitance. To be specific, the measuring device 100 acquires the digital values corresponding to the magnitudes of the electrostatic capacitances between the inner periphery of the focus ring FR and the third electrodes 143 of the respective sensor chips 104A to 104H of the measuring device 100, and stores the digital values in the storage device 165. The digital values can be acquired at timing which is previously set under the control of the processor 164.

In a subsequent process ST4, the measuring device 100 is taken out from the process module and returned back into one of the containers 4a to 4d. In a subsequent process ST5, the digital values stored in the storage device 165 are sent to the controller MC. The digital values may be transmitted from the communication device 166 to the controller MC in response to an instruction from the controller MC, or may be transmitted to the controller MC at preset timing under the control of the processor 164 based on a count of a timer provided at the circuit board 106.

In a subsequent process ST6, the controller MC checks a position of the transfer destination of the measuring device 100 based on the received digital values. To elaborate, based on the digital values, the controller MC checks the distribution of the distances between the inner periphery of the focus ring FR and the edge of the measuring device 100 in the circumferential direction thereof, and determines whether the distribution of the distances between the inner periphery of the focus ring FR and the edge of the measuring device 100 in the circumferential direction can be regarded as being uniform according to a preset criterion.

In case that the distribution of the distance between the inner periphery of the focus ring FR and the edge of the measuring device 100 in the circumferential direction cannot be regarded as being uniform, it is determined in a subsequent process STJ that the coordinate information specifying the transfer destination of the transfer device TU2 needs to be corrected. Then, in a process ST7, the coordinate information of the transfer device TU2 is corrected by the controller MC. By way of example, a correction amount that allows the distribution of the distances between the inner periphery of the focus ring FR and the edge of the measuring device 100 in the circumferential direction to be uniform is calculated based on the digital values, and the coordinate information of the transfer device TU2 is corrected by using the correction amount. Then, the processes ST1 to ST6 and the process STJ are performed again. Meanwhile, in case that the distribution of the distance between the inner periphery of the focus ring FR and the edge of the measuring device 100 in the circumferential direction can be regarded as being uniform, it is determined in the process STJ that the coordinate information specifying the transfer destination of the transfer device TU2 need not be corrected, and the method MT is ended.

According to the method MT using the measuring device 100, the digital values that can be used to correct the coordinate information of the transfer destination of the transfer device TU2 of the processing system 1 are provided by the measuring device 100, and, when necessary, it is possible to correct the coordinate information of the transfer device TU2. By allowing this corrected transfer device TU2 to transfer the wafer W, the distances (gap) between the inner periphery of the focus ring FR and the wafer W can be set to be substantially uniform. As a result, non-uniform distribution of the plasma can be suppressed, and non-uniformity in characteristics such as variation of the etching dimension within the surface of the wafer can be suppressed. Further, it is possible to suppress particles from adhering to the wafer W.

Figure 13:
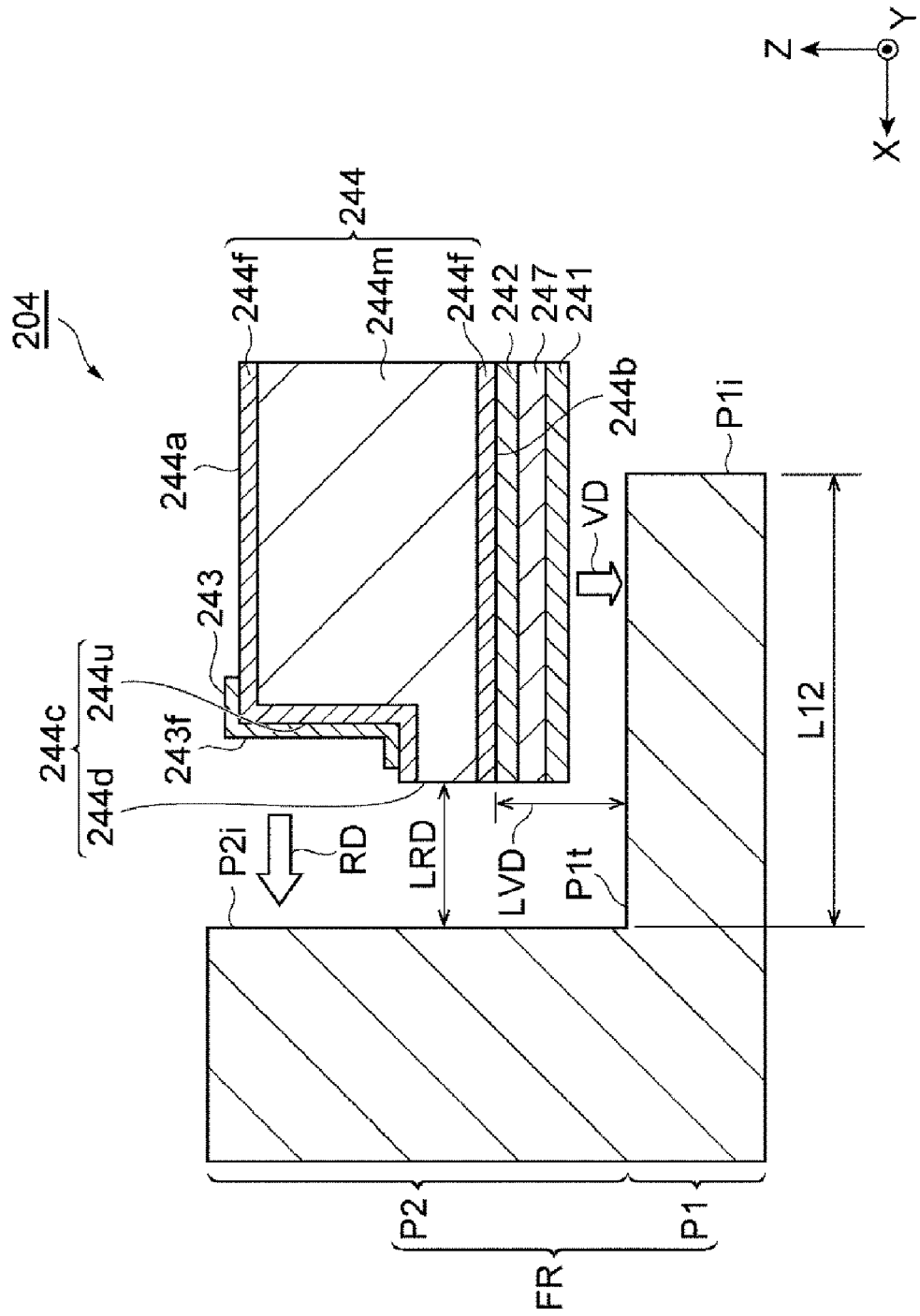
FIG. 13 is a longitudinal cross sectional view of a sensor chip according to another exemplary embodiment.

Hereinafter, a sensor chip according to another exemplary embodiment that can be mounted to the measuring device 100 will be described. FIG. 13 is a cross sectional view of a sensor chip according to another exemplary embodiment. FIG. 13 depicts a longitudinal cross sectional view of a sensor chip 204, in which the focus ring FR as well as the sensor chip 204 is also illustrated.

The sensor chip 204 includes a first electrode 241, a second electrode 242 and a third electrode 243. In the present exemplary embodiment, the sensor chip 204 may further include a substrate member 244 and an insulating region 247.

The substrate member 244 includes a main body 244m and a surface member 244f. The main body 244m is made of, but not limited to, silicon. The surface member 244f is configured to cover a surface of the main body 244m. The surface member 244f is made of an insulating material. For example, the surface member 244f may be a thermal oxide film of silicon.

The substrate member 244 has a top face 244a, a bottom face 244b and a front end face 244c. The second electrode 242 is provided under the bottom face 244b of the substrate member 244, and is extended in the X and Y directions. Further, the first electrode 241 is provided under the second electrode 242 with the insulating region 247 therebetween, and is extended in the X and Y directions.

The front end face 244c of the substrate member 244 has a step shape. That is, a lower portion 244d of the front end face 244c is protruded toward the focus ring FR more than an upper portion 244u of the front end face 244c. The third electrode 243 is extended along the upper portion 244u of the front end face 244c.

In case of using this sensor chip 204 as the sensor chip of the measuring device 100, the first electrode 241 is connected to the wiring 181, the second electrode 242 is connected to the wiring 182, and the third electrode 243 is connected to the wiring 183.

In this sensor chip 204, the third electrode 243 as the sensor electrode is shielded against a space under the sensor chip 204 by the first electrode 241 and the second electrode 242. Accordingly, by using this sensor chip 204, it is possible to measure the electrostatic capacitance with high directivity in a direction (X direction) to which the front face 243f of the third electrode 243 faces.

Figure 2:
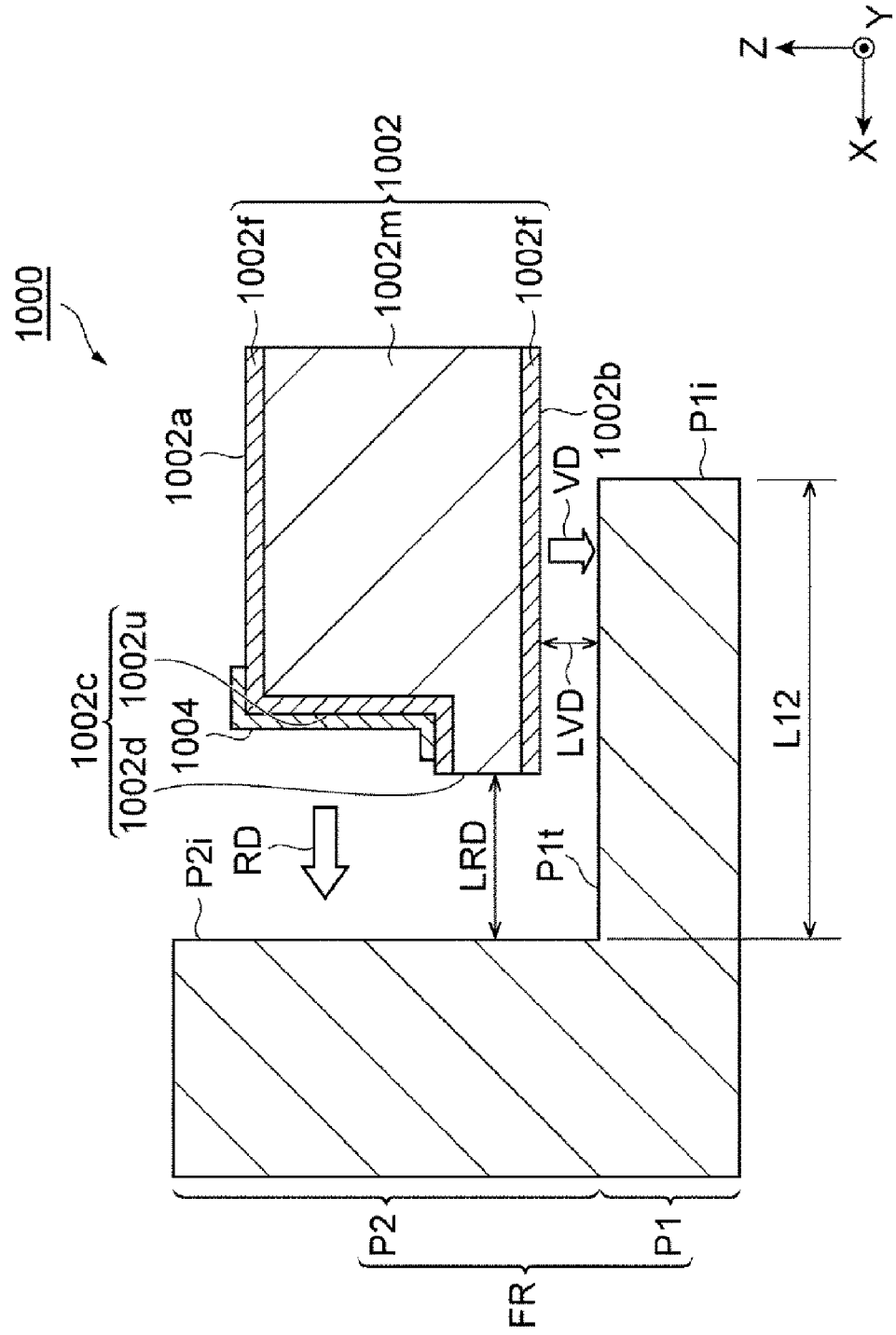
FIG. 2 is a diagram illustrating an example of a sensor chip configured to measure electrostatic capacitance.
Figure 3:
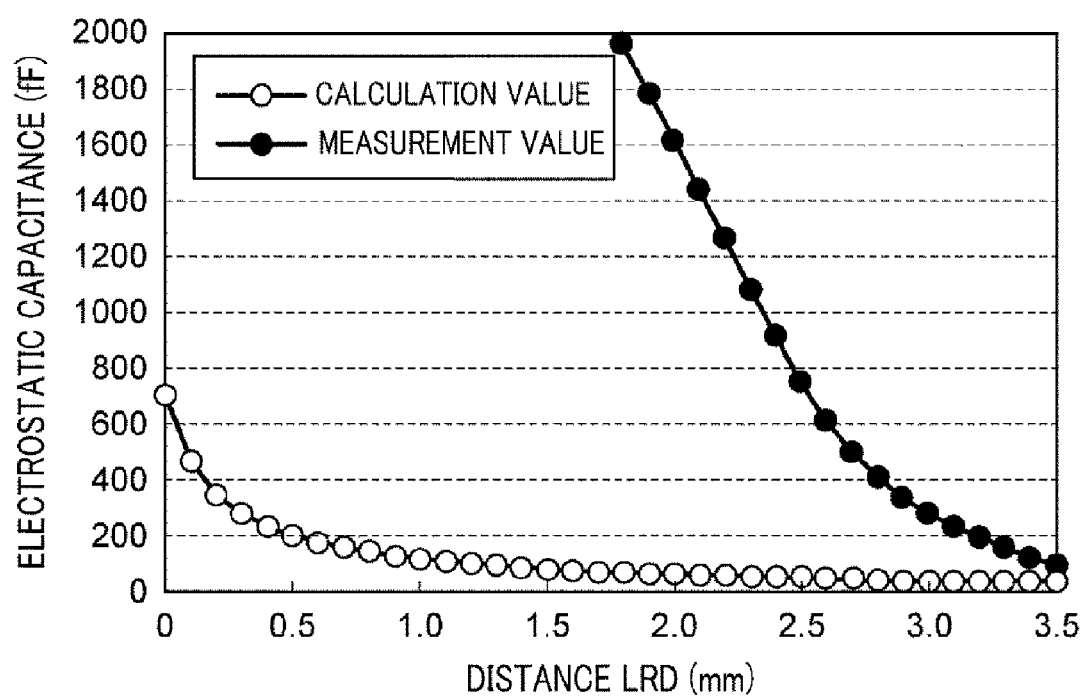
FIG. 3 is a graph showing electrostatic capacitance measured by the sensor chip of FIG. 2.

Hereinafter, a result of evaluating performance of the sensor chip 204 will be described. In this performance evaluation, the third electrode 243 of the sensor chip 204 is connected to an electrostatic capacitance meter, and the electrostatic capacitance is measured while moving the sensor chip 204 in the direction RD toward the inner periphery P2i of the second portion P2 of the focus ring FR. Further, for comparison, the electrode 1004 of the sensor chip 1000 shown in FIG. 2 is connected to an electrostatic capacitance meter, and the electrostatic capacitance is measured while moving the sensor chip 1000 in the direction RD toward the inner periphery P2i of the second portion P2 of the focus ring FR. Furthermore, when measuring the electrostatic capacitance, the distance LVD between the top face P1t of the first portion P1 and the bottom face 244b of the sensor chip 204 is set to be 300 μm. Moreover, when measuring the electrostatic capacitance, the distance LVD between the top face Pit of the first portion P1 and the bottom face 1002b of the sensor chip 1000 is also set to be 300 μm.

Figure 14:
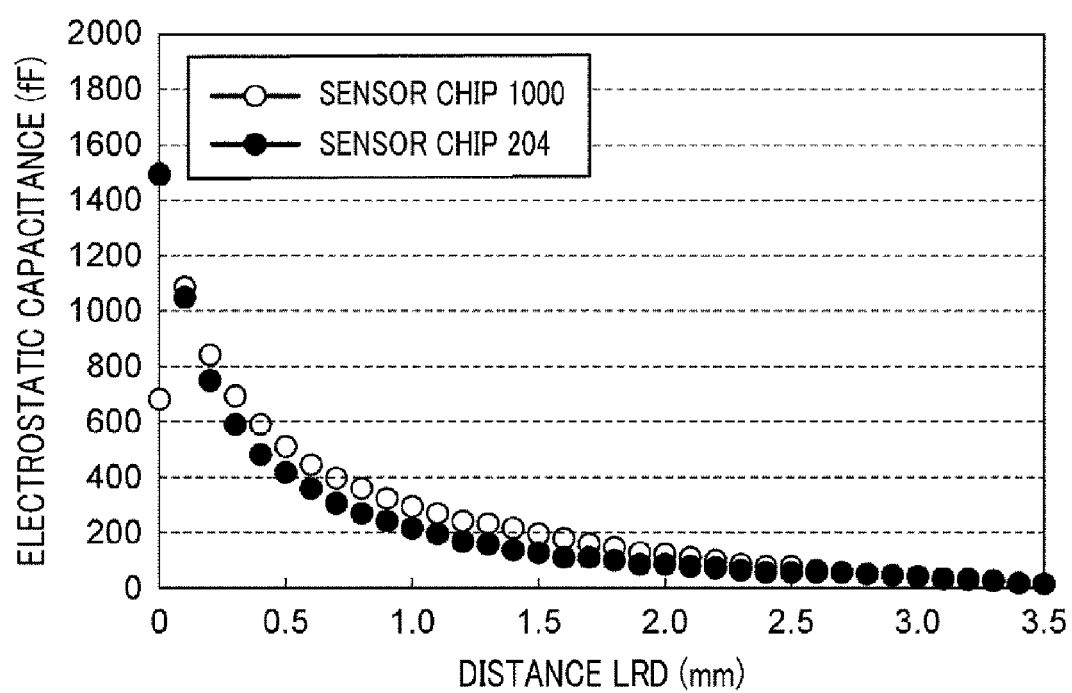
FIG. 14 is a graph showing a result of evaluating performance of sensor chips.

FIG. 14 is a graph showing measurement values of the electrostatic capacitance. In FIG. 14, a horizontal axis represents the distance LRD between the lower portion 244d of the front end face 244c of the sensor chip 204 and the inner periphery P2i of the second portion P2 of the focus ring FR and the distance LRD between the lower portion 1002d of the end surface 1002c of the sensor chip 1000. Further, a vertical axis indicates the electrostatic capacitance. As depicted in FIG. 14, the electrostatic capacitance measured by the sensor chip 1000 is found to increase when the distance LRD is 2.5 mm, whereas an increment of the electrostatic capacitance measured by the sensor chip 204 at the distance LRD of 2.5 mm is found to be reduced. That is, by using the sensor chip 204, it is possible to measure the electrostatic capacitance with high directivity in a certain direction (direction RD of FIG. 13).

Figure 15:
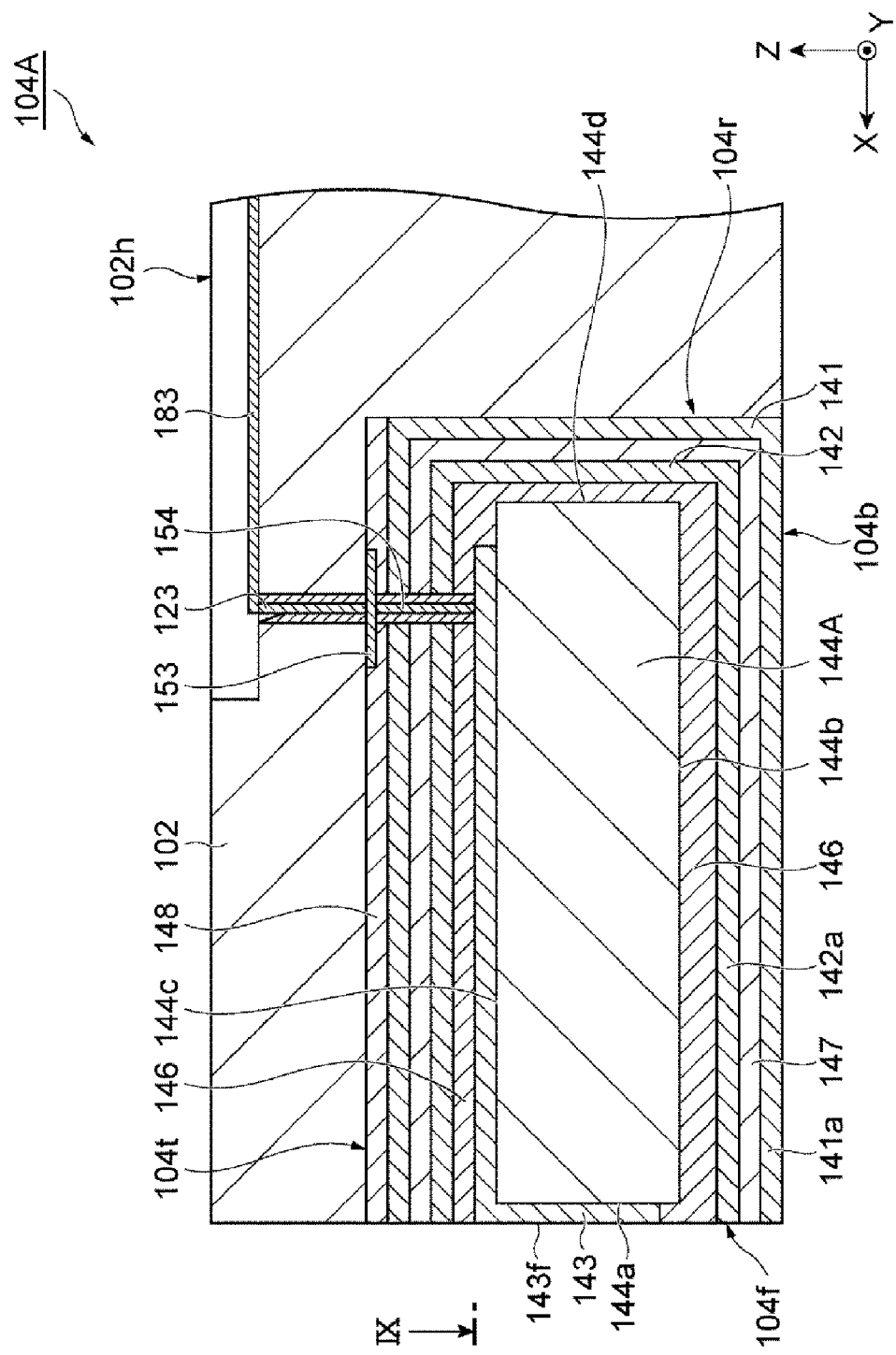
FIG. 15 is a longitudinal cross sectional view of a sensor chip according to still another exemplary embodiment.

Now, a sensor chip according to still another exemplary embodiment that can be mounted to the measuring device 100 will be explained. FIG. 15 is a longitudinal cross sectional view of a sensor chip according to still another exemplary embodiment. The sensor chip 104A shown in FIG. 15 is a modification example of the sensor chip 104, and is different from the sensor chip 104 in that the sensor chip 104A has a substrate member 144A instead of the substrate member 144. The substrate member 144A is made of an insulating material. By way of non-limiting example, the substrate member 144A is formed of borosilicate glass. Further, the substrate member 144A may be made of silicon nitride.

The substrate member 144A is a polyhedron, and has a surface including a front face 144a and a bottom face 144b. As one example, the surface of the substrate member 144A further includes a top face 144c, a rear face 144d and a pair of side faces. The bottom face 144b and the top face 144c are extended in the X and Y directions, and are opposed to each other. The front face 144a constitutes a front end face of the substrate member 144A in the X direction, and is extended in a direction that intersects with the bottom face 144b. The front face 144a may have a preset curvature. This curvature is a reciprocal of a distance between the central axis AX100 and the front face 144a when the sensor chip 104A is mounted to the base substrate 102. The rear face 144d constitutes a rear end face of the substrate member 144A in the X direction, and is opposed to the front face 144a. Further, one of the pair of side faces is extended between one edge of the front face 144a in the Y direction, and one edge of the rear face 144d in the Y direction, and the other of the pair of side surfaces is extended between the other edge of the front face 144a in the Y direction and the other edge of the rear face 144d in the Y direction.

A third electrode 143 is extended along the front face 144a and the top face 144c of the substrate member 144A. An insulating region 146 is extended to cover the bottom face 144b, the top face 144c, the rear face 144d, the pair of side surfaces of the substrate member 144A and the third electrode 143 extended on the top face 144c. A second electrode 142 is provided to cover the insulating region 146. Further, a second portion 142a of the second electrode 142 is extended along the bottom face 144b of the substrate member 144A with the insulating region 146 therebetween. Furthermore, a first electrode 141 is provided to cover the insulating region 147. A first portion 141a of the first electrode 141 is extended under the second portion 142a of the second electrode 142 with the insulating region 147 therebetween.

In case that the main body 144m of the substrate member 144 of the above-described sensor chip 104 is made of silicon, the sensor chip 104 has internal electrostatic capacitance. For the internal electrostatic capacitance, the output of the high frequency oscillator 161 needs to be set to be large. Meanwhile, in case of the sensor chip 104A, since the substrate member 144A is made of the insulating material, the internal electrostatic capacitance is very small. Accordingly, in the measuring device 100 having the sensor chip 104A, the output of the high frequency oscillator 161 can be set to be small.

Moreover, since the measuring device 100 can be used in the temperature range (e.g., 20° C. to 80° C.) including a high temperature and in a decompressed environment (e.g., equal to or less than 1 Torr (133.3 Pa)), gas generation from the substrate member 144A needs to be suppressed. For this purpose, the substrate member 144A may be made of borosilicate glass, silicon nitride, quartz or aluminum oxide. By using this substrate member 144A, the gas generation can be suppressed.

In addition, since the measuring device 100 can be used in the temperature range (e.g., 20° C. to 80° C.) including a high temperature, it is desirable that the substrate member 144A has a linear expansion coefficient which is close to a linear expansion coefficient of the material of the base substrate 102. In case that the base substrate 102 is made of silicon, the substrate member 144A may be formed of, but not limited to, borosilicate glass or silicon nitride. As a result, the linear expansion coefficient of the substrate member 144A may be close to the linear expansion coefficient of the base substrate 102. Accordingly, the damage of the sensor chip 104A and separation of the sensor chip 104A from the base substrate 102 which may be caused by the difference between the linear expansion coefficients of the substrate member 144A and the base substrate 102 can be suppressed.

Furthermore, it is desirable that the measuring device 100 has a small weight. Accordingly, a density (mass per unit volume) of the substrate member 144A is required to be close to or smaller than a density of the base substrate 102. For this reason, in case that the base substrate 102 is made of silicon, the substrate member 144A may be made of, by way of example, but not limitation, borosilicate glass.

In the above, the various exemplary embodiments have been described. However, the exemplary embodiments are not limiting and various modifications may be made. For example, the number of the process modules of the processing system 1 may be one or more. Furthermore, although each of the process modules PM1 to PM6 is described to be implemented by the plasma processing apparatus in the above description, each process module may be implemented by any type of processing apparatus as long as the processing apparatus uses an electrostatic chuck and a focus ring. Moreover, although the above-described plasma processing apparatus 10 is configured as the capacitively coupled plasma processing apparatus, the plasma processing apparatus that can be used as the process modules PM1 to PM6 may be any type of plasma processing apparatus such as an inductively coupled plasma processing apparatus, a plasma processing apparatus using a surface wave such as a microwave, or the like.

Furthermore, in the above-described exemplary embodiments, the controller MC is configured to acquire the digital values from the measuring device 100 and correct the coordinate information of the transfer device TU2. However, the acquisition of the digital values from the measuring device 100 and the correction of the coordinate information of the transfer device TU2 may be performed by another computer provided separately from the controller MC.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A sensor chip that measures electrostatic capacitance, comprising:
a first electrode having a first portion;
a second electrode, having a second portion extended on the first portion, insulated from the first electrode within the sensor chip; and
a third electrode, having a front face extended in a direction which intersects with the first portion and the second portion, provided on the first portion and the second portion and insulated from the first electrode and the second electrode within the sensor chip.

2. The sensor chip of claim 1,
wherein the first electrode and the second electrode are opened toward a side of a region where the front face of the third electrode is provided, and the first electrode and the second electrode are extended to surround the third electrode.

3. The sensor chip of claim 1, further comprising:
an end face,
wherein the end face is a curved surface having a preset curvature, and
the front face of the third electrode is extended along the end face.

4. The sensor chip of claim 1, further comprising:
a substrate member which has a surface including a front face and a bottom face, and is insulated on the surface,
wherein the third electrode is extended along the front face of the substrate member, and
the second portion of the second electrode is extended along the bottom face of the substrate member.

5. The sensor chip of claim 4,
wherein the substrate member is made of an insulating material.

6. The sensor chip of claim 5,
wherein the insulating material is borosilicate glass, silicon nitride, quartz or aluminum oxide.

7. A measuring device of measuring electrostatic capacitance, comprising:
a base substrate;
sensor chips arranged along an edge of the base substrate, each of the sensor chips being a sensor chip as claimed in claim 1; and
a circuit board mounted on the base substrate,
wherein the circuit board comprises:
a ground potential line allowed to be electrically connected to the first electrode;
a high frequency oscillator configured to generate a high frequency signal and electrically connected to the second electrode and the third electrode;
a C/V conversion circuit configured to convert a voltage amplitude in the third electrode of each of the sensor chips into a voltage signal indicating the electrostatic capacitance; and
an A/D converter configured to convert the voltage signal output from the C/V conversion circuit to a digital value.

8. The measuring device of claim 7,
wherein the circuit board further comprises:
a storage device configured to store therein the digital value; and
a communication device configured to wirelessly transmit the digital value stored in the storage device.

9. The measuring device of claim 7,
wherein the circuit board further comprises a switch configured to connect the first electrode to the ground potential line selectively.

10. The measuring device of claim 7,
wherein the base substrate has a disk shape,
each of the sensor chips is a sensor chip as claimed in claim 3, and
the end face of each of the sensor chips is provided along the edge of the base substrate.

* * * * *

UNITED STATES PATENT AND TRADEMARK OFFICE
CERTIFICATE OF CORRECTION

PATENT NO. : 9,903,739 B2
APPLICATION NO. : 15/179189
DATED : February 27, 2018
INVENTOR(S) : Kippei Sugita et al.

It is certified that error appears in the above-identified patent and that said Letters Patent is hereby corrected as shown below:

In the Specification

Column 2, Line 56, replace "Pit" with -- P1t --.

Column 8, Line 65, replace "Phi" with -- P1i --.

Column 17, Line 46, replace "Pit" with -- P1t --.

Signed and Sealed this
Twenty-sixth Day of June, 2018

Andrei Iancu
*Director of the United States Patent and Trademark Office*